US010229964B2

(12) United States Patent
Kim et al.

(10) Patent No.: US 10,229,964 B2
(45) Date of Patent: Mar. 12, 2019

(54) DISPLAY DEVICE

(71) Applicant: Samsung Display Co., Ltd., Yongin-si, Gyeonggi-do (KR)

(72) Inventors: Keon Woo Kim, Yongin-si (KR); Ji Hyun Ka, Yongin-si (KR); Tae Hoon Kwon, Yongin-si (KR); Ho Kyoon Kwon, Yongin-si (KR); Min Ku Lee, Yongin-si (KR); Zail Lhee, Yongin-si (KR); Jin Tae Jeong, Yongin-si (KR); Seung Ji Cha, Yongin-si (KR); Byung Du Ahn, Yongin-si (KR); Jeong Ho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/832,628

(22) Filed: Dec. 5, 2017

(65) Prior Publication Data

US 2018/0240856 A1    Aug. 23, 2018

(30) Foreign Application Priority Data

Feb. 21, 2017    (KR) .......................... 10-2017-0023069

(51) Int. Cl.
*H01L 27/32*    (2006.01)
*H01L 51/00*    (2006.01)
(Continued)

(52) U.S. Cl.
CPC ....... *H01L 27/3276* (2013.01); *G09G 3/3233* (2013.01); *H01L 27/326* (2013.01);
(Continued)

(58) Field of Classification Search
CPC ............... H01L 27/3276; H01L 27/326; H01L 27/3223; H01L 27/3258; H01L 51/0096;
(Continued)

(56) References Cited

U.S. PATENT DOCUMENTS

2016/0240141 A1    8/2016  Lee et al.
2017/0249896 A1*   8/2017  Kim ..................... G09G 3/3225
(Continued)

FOREIGN PATENT DOCUMENTS

| EP | 2085952 A1 | 8/2009 |
| EP | 3264405 A2 | 1/2018 |
| KR | 10-2016-0099770 A | 8/2016 |

OTHER PUBLICATIONS

EPO Extended Search Report dated Jun. 27, 2018, for corresponding European Patent Application No. 18157710.7 (7 pages).

*Primary Examiner* — Syed Gheyas
(74) *Attorney, Agent, or Firm* — Lewis Roca Rothgerber Christie LLP

(57) ABSTRACT

A display device includes a substrate including a first pixel region, a second pixel region having an area smaller than that of the first pixel region, and a peripheral region surrounding the first pixel region and the second pixel region, a second pixel provided in the second pixel region, a second line connected to the second pixel, an extension line extended to the peripheral region, a dummy part located in the peripheral region to overlap with the extension line, a power line connected to the first and second pixel regions, and a connection line located in the peripheral region to be connected to the dummy part, the connection line being electrically connected to a portion of the second pixel region, wherein the second pixel region includes a first sub-pixel region connected to the connection line and a second sub-pixel region except the first sub-pixel region.

29 Claims, 25 Drawing Sheets

(51) Int. Cl.
 *G09G 3/3233* (2016.01)
 *H01L 27/12* (2006.01)
(52) U.S. Cl.
 CPC ...... *H01L 27/3223* (2013.01); *H01L 27/3258* (2013.01); *H01L 27/3262* (2013.01); *H01L 27/3265* (2013.01); *H01L 51/0096* (2013.01); *G09G 2300/0413* (2013.01); *G09G 2300/0426* (2013.01); *G09G 2300/0861* (2013.01); *G09G 2310/0251* (2013.01); *G09G 2310/0262* (2013.01); *H01L 27/124* (2013.01)
(58) Field of Classification Search
 CPC ............. H01L 27/3262; H01L 27/3265; H01L 27/124; G09G 3/3233; G09G 2310/0251; G09G 2300/0861; G09G 2300/0426; G09G 2300/0413; G09G 2310/0262
 See application file for complete search history.

(56) References Cited

U.S. PATENT DOCUMENTS

| | | | |
|---|---|---|---|
| 2018/0005585 A1* | 1/2018 | Kim | G09G 3/3258 |
| 2018/0082630 A1* | 3/2018 | Kim | G09G 3/3233 |
| 2018/0090061 A1* | 3/2018 | Kim | G09G 3/3233 |
| 2018/0151663 A1* | 5/2018 | Kim | H01L 51/5253 |

\* cited by examiner

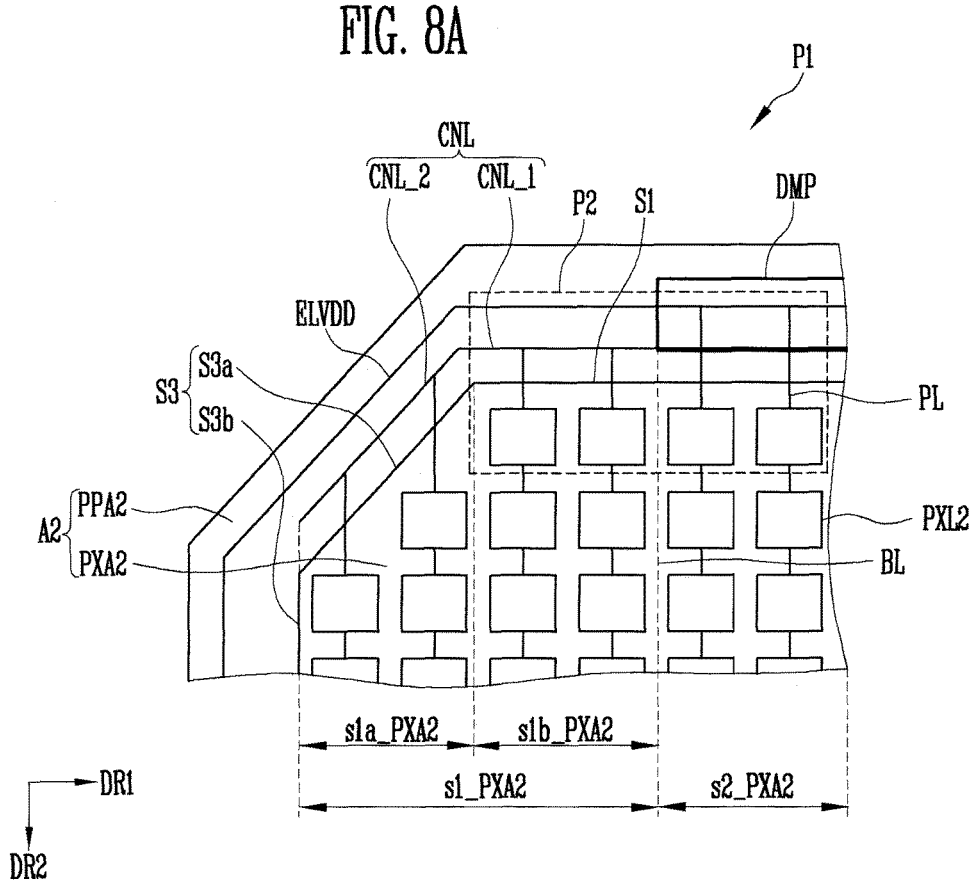

DISPLAY DEVICE

CROSS-REFERENCE TO RELATED APPLICATION

The present application claims priority to, and the benefit of, Korean Patent Application No. 10-2017-0023069, filed on Feb. 21, 2017 in the Korean Intellectual Property Office, the entire disclosure of which is incorporated by reference herein.

BACKGROUND

1. Field

An aspect of the present disclosure relates to a display device.

2. Description of the Related Art

A display device includes a plurality of pixels each including a display element, lines, and a plurality of transistors connected to the lines, the plurality of transistors for driving the display element.

The lines may have different load values according to their lengths, and a pixel region in which the pixels are located may have a size that is changed depending on its position due to a process margin. In a final image provided from the display device, differences in luminance may be caused due to differences between the load values.

SUMMARY

Embodiments provide a display device having uniform luminance.

According to an aspect of the present disclosure, there is provided a display device including a substrate including a first pixel region, a second pixel region having an area that is smaller than an area of the first pixel region and connected to the first pixel region, and a peripheral region at least partially surrounding the first pixel region and the second pixel region, a first pixel in the first pixel region, a second pixel in the second pixel region, a first line connected to the first pixel, a second line connected to the second pixel, an extension line connected to any one of the first line and the second line and extending to the peripheral region, a dummy part in the peripheral region, overlapping with the extension line, and for compensating for a difference between a load value of the first line and a load value of the second line, a power line connected to the first pixel region and the second pixel region, and a connection line in the peripheral region, connected to the dummy part, and electrically connected to a portion of the second pixel region, wherein the second pixel region includes a first sub-pixel region connected to the connection line, and a second sub-pixel region separate from the first sub-pixel region.

The dummy part may include a dummy active pattern on the substrate, a first insulating layer on the dummy active pattern, and defining a first contact hole exposing a portion of the dummy active pattern, the extension line on the first insulating layer, and a conductive pattern on the extension line with a second insulating layer therebetween, connected to the dummy active pattern through the first contact hole, and electrically connected to the connection line.

The conductive pattern and the connection line may be in the same layer.

The dummy part might not correspond to the first sub-pixel region, and may correspond to the second sub-pixel region.

The first sub-pixel region and the second sub-pixel region may have different shapes.

A fixed voltage may be applied to the power line, and a voltage having the same level as the fixed voltage may be applied to the conductive pattern and the connection line.

The power line may include a first metal layer in the same layer as the conductive pattern and the connection line, a second metal layer on the first metal layer, and an interlayer insulating layer between the first and second metal layers, and defining a second contact hole through which a portion of the first metal layer is exposed, wherein the second metal layer is electrically connected to the first metal layer through the second contact hole.

The connection line may include a third metal layer integrally provided with the conductive pattern, a fourth metal layer on the third metal layer, and the interlayer insulating layer between the third and fourth metal layers, and defining a third contact hole through which a portion of the third metal layer is exposed, wherein the fourth metal layer is electrically connected to the third metal layer through the third contact hole.

The connection line may be on the conductive pattern, and may be electrically connected to the conductive pattern through a fourth contact hole through the interlayer insulating layer.

The peripheral region may include a first peripheral region at the periphery of the first pixel region, a second peripheral region at the periphery of the second pixel region, and an additional peripheral region adjacent to the first pixel region and the second peripheral region.

The dummy part may be in the second peripheral region.

The dummy part may be electrically connected to the first sub-pixel region through the connection line.

The first line may extend along a first direction on the substrate, and may provide a scan signal to the first pixel, and the second line my provide a scan signal to the second pixel along the first direction.

The second line may extend to the peripheral region and may be connected to the extension line.

The extension line may be integrally provided with the second line.

A length of the first line may be longer than a length of the second line.

The display device may further include a first emission control line connected to the first pixel, and a second emission control line connected to the second pixel.

The second emission control line may extend to the peripheral region and is connected to the extension line.

The display device may further include a data line spaced apart from the power line and extending along a second direction that intersects the first direction.

The second pixel may include a transistor connected to the second line, the data line, and the power line, the transistor including an active pattern on the substrate, a gate electrode on the active pattern with a gate insulating layer interposed therebetween, and source and drain electrodes each connected to the active pattern.

The display device may further include a light emitting device connected to the transistor, and including a first electrode connected to the transistor, an emitting layer on the first electrode, and a second electrode on the emitting layer.

The display device may further include a power supply line integrally formed with the conductive pattern, in the peripheral region, and at least partially surrounding an edge of the connection line.

The connection line may have a shape corresponding to the power supply line.

The connection line may have an inclined oblique shape in the peripheral region corresponding to a portion of the first sub-pixel region.

The connection line may have a bent curved shape in the peripheral region corresponding to a portion of the first sub-pixel region.

The connection line may have a step shape including a stepped part in the peripheral region corresponding to a portion of the first sub-pixel region.

The substrate may further includes a third pixel region spaced apart from the second pixel region, and connected to the first pixel region, and a third peripheral region at least partially surrounding the third pixel region.

The dummy part may be in the third peripheral region.

The display device may further include a third pixel provided in the third pixel region, and a third line for providing a scan signal to the third pixel, and connected to the extension line.

BRIEF DESCRIPTION OF THE DRAWINGS

Example embodiments will now be described more fully hereinafter with reference to the accompanying drawings. However, the embodiments may be embodied in different forms, and should not be construed as strictly limited to the embodiments set forth herein. Rather, these embodiments are provided so that this disclosure will be thorough and complete, and will fully convey the scope of the example embodiments to those skilled in the art.

FIGS. 8A to 8C are plan views conceptually illustrating a portion corresponding to the area P1 of FIG. 1.

DETAILED DESCRIPTION

Figure 1:
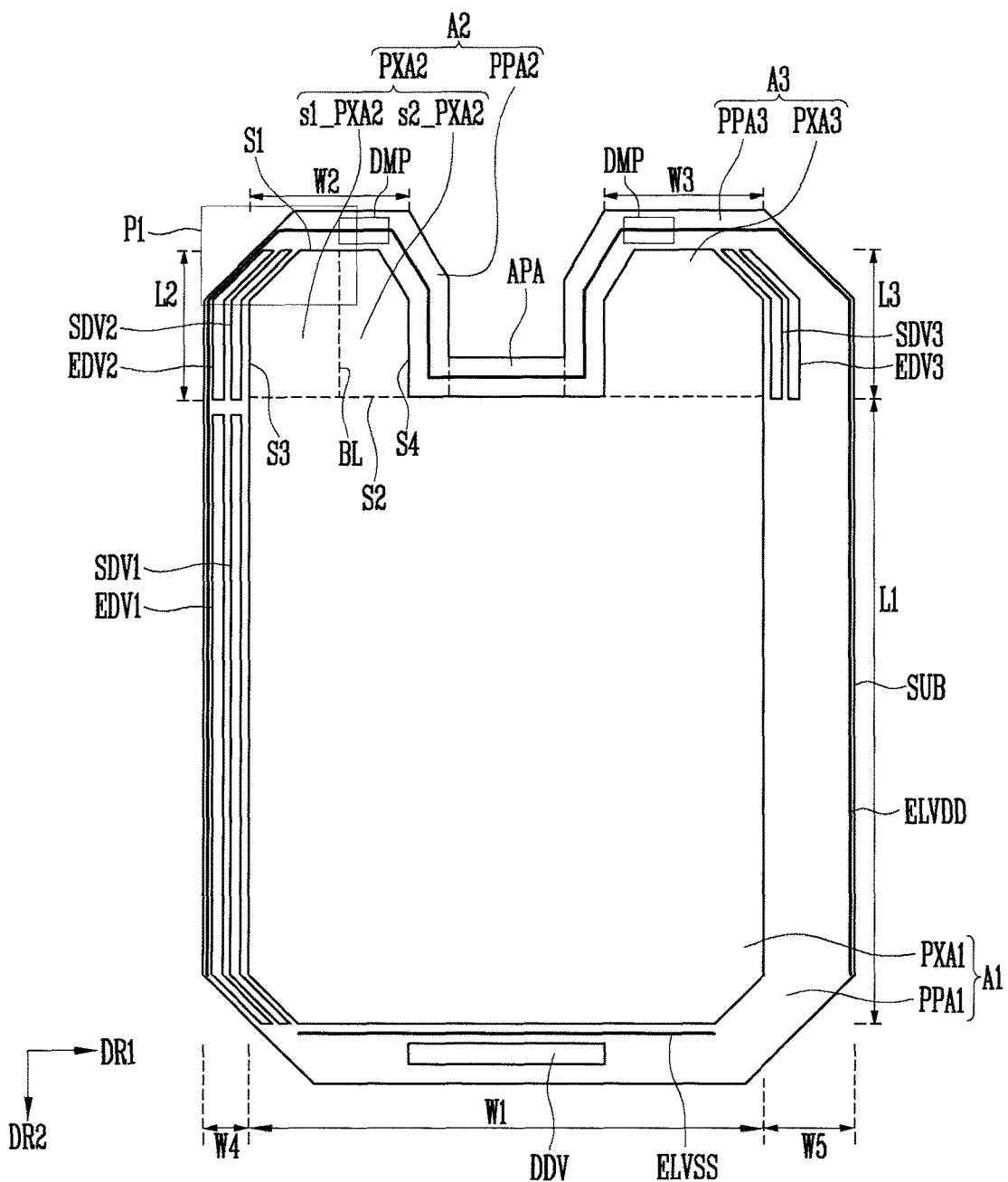
FIGS. 1 and 2 are plan views illustrating a display device according to an embodiment of the present disclosure.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, exemplary embodiments of the present disclosure will be described in detail with reference to the accompanying drawings.

Figure 2:
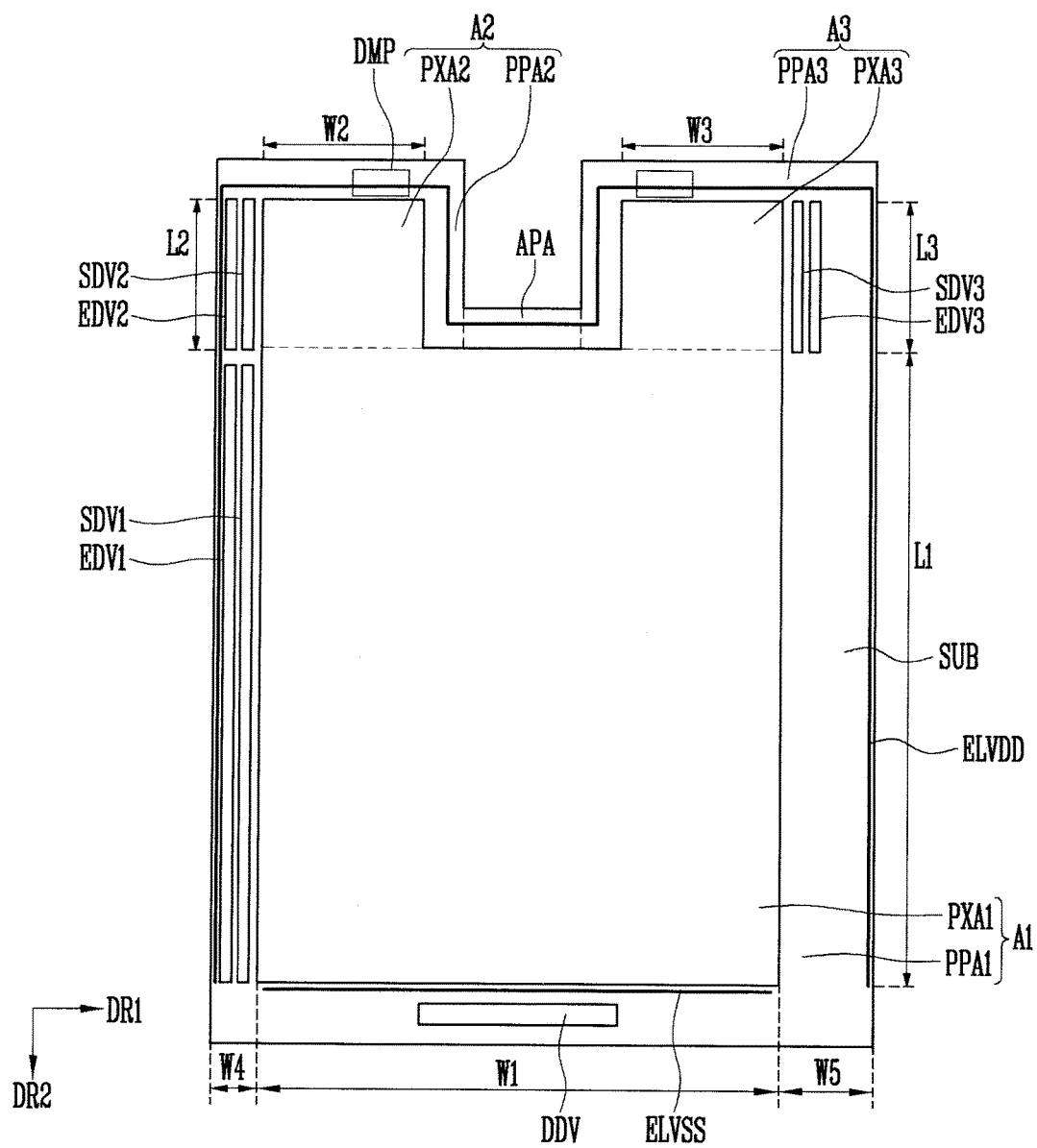

FIGS. 1 and 2 are plan views illustrating a display device according to an embodiment of the present disclosure.

Referring to FIGS. 1 and 2, the display device according to the present embodiment may include a substrate SUB, pixels on the substrate SUB, a drive unit on the substrate SUB for driving the pixels, a power supply unit for supplying power to the pixels, and a line unit connecting the pixels to the drive unit.

The substrate SUB includes a plurality of regions, and at least two of the regions may have different areas. As an example, the substrate SUB may have two regions, and the two regions may have areas that are different from each other. As another example, the substrate SUB may have three regions. In this case, all of the three regions may have areas that are each different from one another, or only two regions of the three regions may have areas that are different from each other. As still another example, the substrate SUB may have four or more regions.

In the following embodiment, for convenience of description, a case where the substrate SUB includes three regions (i.e., first to third regions A1, A2, and A3) is illustrated as an example.

The first to third regions A1, A2, and A3 may have various shapes. For example, the first to third regions A1, A2, and A3 may be provided in various shapes such as a closed-shape polygon including linear sides, a circle, an ellipse, etc., including curved sides, a semicircle, a semi-ellipse, etc., including linear and curved sides.

Each of the first to third regions A1, A2, and A3 may have an approximately rectangular shape. In addition, in the first to third regions A1, A2, and A3, at least some of the corners of each shape may have an inclined shape of which width becomes narrower as it becomes more distant from a boundary between the first region A1 and the second and third regions A2 and A3.

The first to third regions A1, A2, and A3 may include pixel regions PXA1, PXA2, and PXA3 (hereinafter, referred to as "PXA") and peripheral regions PPA1, PPA2, and PPA3 (hereinafter, referred to as "PPA"), respectively. The pixel regions PXA are regions in which the pixels for displaying an image are provided. Each pixel will be described later.

In an embodiment of the present disclosure, the first to third pixel regions PXA1, PXA2, and PXA3 may roughly have shapes corresponding to those of the first to third regions A1, A2, and A3, respectively.

The peripheral regions PPA are regions in which the pixels are not provided, and no image is displayed in the peripheral regions PPA. The drive unit for driving the pixels, the power supply unit for supplying power to the pixels, and some of the lines for connecting the pixels to the drive unit may be provided in the peripheral regions PPA. The peripheral regions PPA correspond to a bezel in a final display device, and widths of the bezel may be determined based on those of the peripheral regions.

Each of the first to third regions A1, A2, and A3 will be described as follows.

The first region A1 may have the largest area among the first to third areas A1, A2, and A3. The first region A1 may include a first pixel region PXA1 in which an image is displayed, and a first peripheral region PPA1 surrounding at least one portion of the first pixel region PXA1.

The first pixel region PXA1 may be provided in a shape corresponding to that of the first region A1. In an embodiment of the present disclosure, the first pixel region PXA1 may have a first width W1 in a first direction DR1, and may have a first length L1 in a second direction DR2 intersecting the first direction DR1.

The first peripheral region PPA1 may be provided at at least one side of the first pixel region PXA1. In an embodiment of the present disclosure, the first peripheral region PPA1 surrounds the circumference of the first pixel region PXA1, but may be provided at a portion excluding portions at which the second region A2 and the third region A3 are located. In an embodiment of the present disclosure, the first peripheral region PPA1 may include a lateral part extending in the first direction DR1 and a longitudinal part extending in the second direction DR2. The longitudinal part of the first peripheral region PPA1 may be provided in a pair spaced apart from each other along the first direction DR1 with the first pixel region PXA1 interposed therebetween.

The second region A2 may have an area that is smaller than that of the first region A1. The second region A2 may include a second pixel region PXA2 in which an image is displayed, and a second peripheral region PPA2 surrounding at least one portion of the second pixel region PXA2.

The second pixel region PXA2 may be provided in a shape corresponding to the shape of the second region A2. The second pixel region PXA2 may include a pair of lateral sides S1 and S2 extending along the first direction DR1, and a pair of longitudinal sides S3 and S4 extending along the second direction DR2. The pair of longitudinal sides S3 and S4 may partially include an oblique line inclined in one direction. Here, the pair of longitudinal sides S3 and S4 may include a first longitudinal side S3 and a second longitudinal side S4, which face each other.

In an embodiment of the present disclosure, the second pixel region PXA2 may have a second width W2 that is smaller than a first width W1 of the first region A1. The second pixel region PXA2 may have a second length L2 that is smaller than a first length L1 of the first region A1. The second pixel region PXA2 is provided in a shape protruding from the first pixel region PXA1, and may be directly connected to the first pixel region PXA1. In other words, one side of the second pixel region PXA2 may be in contact with one side of the first pixel region PXA1. Here, the second pixel region PXA2 may include first and second sub-regions s1_PXA2 and s2_PXA2 that are separated based on a virtual line BL. The first and second sub-regions s1_PXA2 and s2_PXA2 will be described later.

The second peripheral region PPA2 may be provided at at least one side of the second pixel region PXA2. In an embodiment of the present disclosure, the second peripheral region PPA2 partially surrounds the second pixel region PXA2, but may not be provided at a portion at which the first pixel region PXA1 and the second pixel region PXA2 are connected to each other. In an embodiment of the present disclosure, the second peripheral region PPA2 may also include a lateral part extending in the first direction DR1, and a longitudinal part extending in the second direction DR2. The longitudinal part of the second peripheral region PPA2 may be provided in a pair spaced apart from each other along the first direction DR1 with the second pixel region PXA2 interposed therebetween.

The third region A3 may have an area that is smaller than that of the first region A1. For example, the third region A3 may have the same area as the second region A2. The third region A3 may include a third pixel region PXA3 in which an image is displayed, and a third peripheral region PPA3 surrounding at least a portion of the third pixel region PXA3.

The third pixel region PXA3 may be provided in a shape corresponding to that of the third region A3. In an embodiment of the present disclosure, the third pixel region PXA3 may have a third width W3 that is smaller than the first width W1 of the first region A1. The third pixel region PXA3 may have a third length L3 that is smaller than the first length L1 of the first region A1. The second width W2 and the third width W3 may be equal to each other. In addition, the second length L2 and the third length L3 may be equal to each other.

The third pixel region PXA3 is provided in a shape protruding from the first pixel region PXA1, and may be directly connected to the first pixel region PXA1. In other words, one side of the third pixel region PXA3 may be in contact with one side of the first pixel region PXA1.

The third peripheral region PPA3 may be provided at at least one side of the third pixel region PXA3. In an embodiment of the present disclosure, the third peripheral region PPA3 partially surrounds the third pixel region PXA3, but may not be provided at a portion at which the first pixel region PXA1 and the third pixel region PXA3 are connected to each other. In an embodiment of the present disclosure, the third peripheral region PPA3 may also include a lateral part extending in the first direction DR1 and a longitudinal part extending in the second direction DR2. The longitudinal part of the third peripheral region PPA3 may be provided in a pair spaced apart from each other along the first direction with the third pixel region PXA3 interposed therebetween.

In an embodiment of the present disclosure, with respect to a virtual center line extending along the second direction DR2 at a middle point of the lateral part of the first peripheral region PPA1 of the first region A1, the third region A3 may have a shape that is linearly symmetric to the second region A2. In this case, an arrangement relationship of components provided in the third region A3 may be substantially identical to that in the second region A2 with the exception of some lines.

Therefore, the substrate SUB may have a shape in which the second region A2 and the third region A3 protrude in the second direction DR2 from the first region A1. In addition, because the second region A2 and the third region A3 are located to be spaced apart from each other, the substrate SUB may have a shape in which it is depressed (e.g., in which a portion is omitted) between the second region A2 and the third region A3. That is, the substrate SUB may have a region spaced between the second region A2 and the third region A3.

In an embodiment of the present disclosure, the longitudinal parts of the first peripheral region PPA1 may be respectively connected to some of the longitudinal parts of the second peripheral region PPA2 and the third peripheral region PPA3. For example, a left longitudinal part of the first peripheral region PPA1 may be connected to a left longitudinal part of the second peripheral region PPA2. In addition, the left longitudinal part of the first peripheral region PPA1 and the left longitudinal part of the second peripheral region PPA2 may have a same width W4 (hereinafter, referred to as a "fourth width"). A right longitudinal part of the first peripheral region PPA1 may be connected to a right longitudinal part of the third peripheral region PPA3. In addition, the right longitudinal part of the first peripheral region PPA1 and the right longitudinal part of the third peripheral region PPA3 may have a same width W5 (hereinafter, referred to as a "fifth width").

The fourth width W4 may be different from the fifth width W5. For example, the fourth width W4 may be smaller than the fifth width W5.

In an embodiment of the present disclosure, the substrate SUB may further include an additional peripheral region APA. The additional peripheral region APA may be next to the first pixel region PXA1, the second peripheral region PPA2, and the third peripheral region PPA3. For example, the additional peripheral region APA may connect the second peripheral region PPA2 and the third peripheral region PPA3. For example, the peripheral region APA may connect a right longitudinal part of the second peripheral region PPA2 and a left longitudinal part of the third peripheral region PPA3. That is, the additional peripheral region APA may be provided at a side of the first pixel region PXA1 between the second region A2 and the third region A3.

The pixels PXL may be provided in the pixel regions PXA (i.e., in the first to third pixel regions PXA1, PXA2, and PXA3) on the substrate SUB. Each pixel PXL is a minimum unit for displaying an image, and a plurality of pixels PXL may be provided in the first to third pixel regions PXA1, PXA2, and PXA3. The pixels PXL may include a display element that emits light. For example, the display element may be any one of a liquid crystal display (LCD) element, an electrophoretic display (EPD) element, an electrowetting display (EWD) element, and an organic light emitting display (OLED) element. Meanwhile, in an embodiment of the present disclosure, a case where the display element is an OLED element will be illustrated below as an example for convenience of description.

Each of the pixels may emit light of one of red, green, and blue, but the present disclosure is not limited thereto. For example, each of the pixels may emit light of a color such as cyan, magenta, yellow, or white.

The pixels may include first pixels arranged in the first pixel region PXA1, second pixels arranged in the second pixel region PXA2, and third pixels arranged in the third pixel region PXA3. In an embodiment of the present disclosure, each of the first to third pixels may be provided in plurality to be arranged in a matrix form along rows extending in the first direction DR1 and columns extending in the second direction DR2. However, the arrangement form of the first to third pixels is not particularly limited, and the first to third pixels may be arranged in various forms.

In the second region A2 and the third region A3, a number of the second pixels and the third pixels may be changed depending on rows. For example, in the second region A2 and the third region A3, a number of second pixels and third pixels, that are located on a row corresponding to a corner configured as a diagonal side having the inclination may be smaller than that of second pixels and third pixels that are located on a row corresponding to a corner configured as a linear side. In addition, the number of second pixels and third pixels, which are located on the row, may decrease as the length of the row becomes shorter. Therefore, lengths of lines connecting the second pixels and the third pixels may be shortened.

The drive unit provides a signal to each pixel through the line unit, thereby controlling driving of each pixel.

The drive unit may include scan drivers SDV1, SDV2, and SDV3 (hereinafter, referred to as "SDV"), which provide a scan signal to each pixel along a scan line, emission drivers EDV1, EDV2, and EDV3 (hereinafter, referred to as "EDV"), which provide an emission control signal to each pixel along an emission control line, a data driver DDV, which provides a data signal to each pixel along a data line, and a timing controller. The timing controller may control the scan drivers SDV, the emission drivers EDV, and the data driver DDV.

In an embodiment of the present disclosure, the scan drivers SDV may include a first scan driver SDV1 connected to the first pixels, a second scan driver SDV2 connected to the second pixels, and a third scan driver SDV3 connected to the third pixels. In an embodiment of the present disclosure, the emission drivers EDV may include a first emission driver EDV1 connected to the first pixels, a second emission driver EDV2 connected to the second pixels, and a third emission driver EDV3 connected to the third pixels.

The first scan driver SDV1 may be located at the longitudinal part in the first peripheral region PPA1. Because the peripheral part of the first peripheral region PPA1 is provided as a pair spaced apart from each other along the width direction of the first pixel region PXA1, the first scan driver SDV1 may be located at at least one side of the longitudinal part of the first peripheral region PPA1. The first scan driver SDV1 may extend along the length direction of the first peripheral region PPA1.

In a similar manner, the second scan driver SDV2 may be located in the second peripheral region PPA2, and the third scan driver SDV3 may be located in the third peripheral region PPA3.

Similar to the first scan driver SDV1, the first emission driver EDV1 may also be located at the longitudinal part in the first peripheral region PPA1. The first emission driver EDV1 may be located at at least one side of the longitudinal part of the first peripheral region PPA1. The first emission driver EDV1 may extend along the length direction of the first peripheral region PPA1.

In a similar manner, the second emission driver EDV2 may be located in the second peripheral region PPA2, and the third emission driver EDV3 may be located in the third peripheral region PPA3.

The data driver DDV may be located in the first peripheral region PPA1. Particularly, the data driver DDV may be located at the lateral part of the first peripheral region PPA1. The data driver DDV may extend along the width direction of the first peripheral region PPA1.

In other embodiments, the positions of the scan drivers SDV, the emission drivers EDV, and/or the data driver DDV may be changed.

The timing controller may be connected through lines, and in various manners, to the first to third scan drivers SDV1, SDV2, and SDV3, to the first to third emission drivers EDV1, EDV2, and EDV3, and to the data driver DDV. The position at which the timing controller is located is not particularly limited. For example, the timing controller may be mounted on a printed circuit board to be connected to the first to third scan drivers SDV1, SDV2, and SDV3, to the first to third emission drivers EDV1, EDV2, and EDV3, and to the data driver DDV through a flexible printed circuit board. The printed circuit board may be located at various positions, such as one side of the substrate SUB and/or a back side of the substrate SUB.

The power supply unit may include at least one power supply line. For example, the power supply unit may include a first power supply line ELVDD and a second power supply line ELVSS. The first power supply line ELVDD and the second power supply line ELVSS may supply power to the plurality of pixels.

One of the first power supply line ELVDD and the second power supply line ELVSS (e.g., the second power supply line ELVSS) may be located to at least correspond to one side of the first peripheral region PPA1, one side of the second peripheral region PPA2, and/or one side of the third peripheral region PPA3. For example, the second power supply line ELVSS may be located in a region in which the data driver DDV of the first peripheral region PPA1 is located. In addition, the second power supply line ELVSS may extend along the first direction DR1 in the first peripheral region PPA1.

The other of the first power supply line ELVDD and the second power supply line ELVSS (e.g., the first power supply line ELVDD) may be located to surround or to partially surround the first pixel region PXA1, the second pixel region PXA2, and the third pixel region PXA3 with the exception of the region in which the data driver DDV of the first peripheral region PPA1 is located. For example, the first power supply line ELVDD may have a shape extending along the left longitudinal part of the first peripheral region PPA1, along the second peripheral region PPA2, the third peripheral region PPA3, and the additional peripheral region APA, and along the right longitudinal part of the first peripheral region PPA1.

In the above, the location of the second power supply line ELVSS corresponds to one side of the first pixel region PXA1 in the first peripheral region PPA1, and the first power supply line ELVDD is located in the other peripheral regions PPA, as an example, but the present disclosure is not limited thereto.

A voltage applied to the first power supply line ELVDD may be higher than a voltage applied to the second power supply line ELVSS.

Meanwhile, a length of a second scan line provided in the second pixel region PXA2 and a length of a third scan line provided in the third pixel region PXA3 are different from a length of a first scan line provided in the first pixel region PXA1. Similarly, a length of a second emission control line connected to the second pixel region PXA2 and a length of a third emission control line connected to the third pixel region PXA3 are different from a length of a first emission control line connected to the first pixel region PXA1. A difference in length between lines provided in the respective pixel regions PXA may cause a difference in load values between the respective pixel regions PXA.

In an embodiment of the present disclosure, as a dummy part DMP is provided or is not provided in the peripheral region PPA corresponding to each pixel region PXA to compensate for the difference in load values between the respective pixel regions PXA, structures having different parasitic capacitances may be provided. The dummy part DMP may be located in each of the second peripheral region PPA2 and the third peripheral region PPA, but the present disclosure is not limited thereto. The dummy part DMP will be further described later with reference to FIG. 10.

Figure 3:
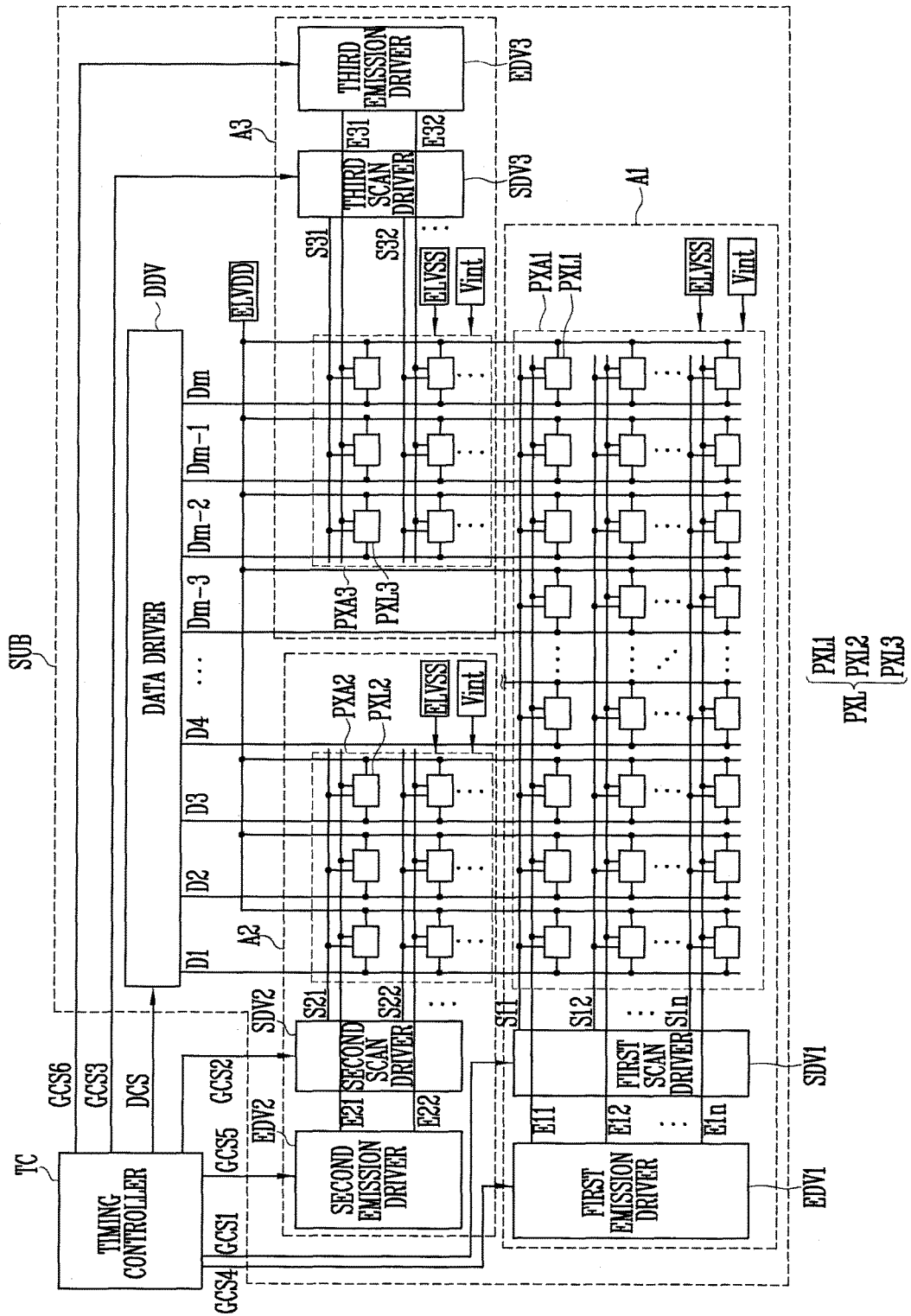
FIG. 3 is a block diagram illustrating an embodiment of pixels and a drive unit in the display device of FIG. 1.

FIG. 3 is a block diagram illustrating an embodiment of the pixels and the drive unit in the display device of FIG. 1. In FIG. 3, for convenience, ELVDD as a first power source provides the same reference numeral as the first power source line ELVDD of FIG. 1, and ELVSS as a second power source provides the same reference numeral as the second power supply line ELVSS of FIG. 1.

Referring to FIG. 3, the display device may include pixels PXL, a drive unit, and a line unit. The pixels PXL may include first to third pixels PXL1, PXL2, and PXL3, and the drive unit may include first to third scan drivers SDV1, SDV2, and SDV3, first to third emission drivers EDV1, EDV2, and EDV3, a data driver DDV, and a timing controller TC. In FIG. 3, positions of the first to third scan drivers SDV1, SDV2, and SDV3, the first to third emission drivers EDV1, EDV2, and EDV3, the data driver DDV, and the timing controller TC are set for convenience of description. When an actual display device is implemented, the first to third scan drivers SDV1, SDV2, and SDV3, the first to third emission drivers EDV1, EDV2, and EDV3, the data driver DDV, and the timing controller TC may be located at other positions in the display device. For example, the data driver DDV is located in a region closer to second and third regions A2 and A3 than a first region A1, but the present disclosure is not limited thereto. For example, the data driver DDV may be located in a region adjacent to the first region A1.

The line unit provides signals of the drive unit to each pixel PXL, and may include scan lines D1 to Dm, emission control lines, a first power supply line (see ELVDD of FIG. 1), a second power supply line (see ELVSS of FIG. 1), and an initialization power line. The scan lines may include first to third scan lines S11 to S1$n$, S21 and S22, and S31 and S32 respectively connected to the first to third pixels PXL1, PXL2, and PXL3, and the emission control lines may include first to third emission lines E11 to E1$n$, E21 and E22, and E31 and E32 respectively connected to the first to third pixels PXL1, PXL2, and PXL3. The data lines D1 to Dm and the first and second power lines ELVSS and ELVDD may be connected to the first to third pixels PXL1, PXL2, and PXL3, respectively.

The first pixels PXL1 are located in a first pixel region PXA1. The first pixels PXL1 may be connected to the first scan lines S11 to S1$n$, the first emission control lines E11 to E1$n$, and the data lines D1 to Dm. The first pixels PXL1 receive a data signal supplied from the data lines D1 to Dm when a scan signal is supplied from the first scan lines S11 to S1$n$. Each of the first pixels PXL1 supplied with the data signal may control the amount of current flowing from the first power source ELVDD applied to the first power supply line ELVDD to the second power source ELVSS via a respective organic light emitting device.

The second pixels PXL2 are located in a second pixel region PXA2. The second pixels PXL2 are connected to the second scan lines S21 and S22, the second emission control lines E21 and E22, and the data lines D1 to Dm. The second pixels PXL2 receive a data signal supplied from the data lines D1 to Dm when a scan signal is supplied from the second scan lines S21 and S22. Each of the second pixels PXL2 supplied with the data signal may control the amount of current flowing from the first power source ELVDD to the second power source ELVSS via a respective organic light emitting device.

The third pixels PXL3 are located in a third pixel region PXA3 defined by the third scan lines S31 and S32, the third emission control lines E31 and E32, and the data lines D1 to Dm. The third pixels PXL3 receive a data signal supplied from the data lines D1 to Dm when a scan signal is supplied from the third scan lines S31 and S32. Each of the third pixels PXL3 supplied with the data signal may control the amount of current flowing from the first power source ELVDD to the second power source ELVSS via a respective organic light emitting device.

The first scan driver SDV1 may supply a scan signal to the first scan lines S11 to S1$n$ in response to a first gate control signal GCS1 from the timing controller TC. For example, the first scan driver SDV1 may sequentially supply the scan signal to the first scan lines S11 to S1$n$. If the scan signal is sequentially supplied to the first scan lines S11 to S1$n$, the first pixels PXL1 may be sequentially selected in units of horizontal lines.

The second scan driver SDV2 may supply a scan signal to the second scan lines S21 and S22 in response to a second gate control signal GCS2 from the timing controller TC. For example, the second scan driver SDV2 may sequentially supply the scan signal to the second scan lines S21 and S22. If the scan signal is sequentially supplied to the second scan lines S21 and S22, the second pixels PXL2 may be sequentially selected in units of horizontal lines.

The third scan driver SDV3 may supply a scan signal to the third scan lines S31 and S32 in response to a third gate control signal GCS3 from the timing controller TC. For example, the third scan driver SDV3 may sequentially supply the scan signal to the third scan lines S31 and S32. If the scan signal is sequentially supplied to the third scan lines S31 and S32, the third pixels PXL3 may be sequentially selected in units of horizontal lines.

The first emission driver EDV1 may supply an emission control signal to the first light emitting control lines E11 to E1$n$ in response to a fourth gate control signal GCS4. For example, the first emission driver EDV1 may sequentially supply the emission control signal to the first emission control lines E11 to E1$n$.

Here, the emission control signal may be set to have a pulse width that is wider than that of the scan signal. For example, an emission control signal supplied to an ith (i is a natural number) first emission control line E1$i$ may be supplied to overlap with, for at least one period, a scan signal supplied to an (i−1)th first scan line S1$i$−1 and a scan signal supplied to an ith first scan line S1$i$.

The second emission driver EDV2 may supply an emission control signal to the second emission control lines E21 and E22 in response to a fifth gate control signal GCS5. For example, the second emission driver EDV2 may sequentially supply the emission control signal to the second emission control lines E21 and E22.

The third emission driver EDV3 may supply an emission control signal to the third emission control lines E31 and E32 in response to a sixth gate control signal GCS6. For example, the third emission driver EDV3 may sequentially supply the emission control signal to the third emission control lines E31 and E32.

Additionally, the emission control signal may be set to a gate-off voltage (e.g., a high voltage) such that respective transistors included in the pixels PXL can be turned off, and the scan signal may be set to a gate-on voltage (e.g., a low voltage) such that respective transistors included in the pixels PXL can be turned on.

The data driver DDV may supply a data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the emission drivers EDV, the gate control signals GCS1 to GCS6 generated based on externally supplied timing signals. Also, the timing controller TC may supply the data control signal DCS to the data driver DDV.

A start pulse and clock signals may be included in each of the gate control signals GCS1 to GCS6. The start pulse may control a timing of a first scan signal or a first emission control signal. The clock signals may be used to shift the start pulse.

A source start pulse and clock signals may be included in the data control signal DCS. The source start pulse may control a sampling start time of data. Color signals may be used to control a sampling operation.

As described above, in the display device of the present embodiment, the pixels PXL may be provided in the regions A1, A2, and A3 having areas that are different from one another. Lengths of the scan lines S11 to S1$n$, S21 and S22, and S31 and S32 and the emission control lines E11 to E1n, E21 and E22, and E31 and E32, which provide signals to the pixels PXL, may be changed depending on the regions A1, A2, and A3 (e.g., depending on areas of the pixel regions PXA). For example, the first width W1 of the first pixel region PXA1 may be longer than the second width W2 of the second pixel region PXA2. Accordingly, when the scan lines S11 to S1n, S21 and S22, and S31 and S32 and the emission control lines E11 to E1n, E21 and E22, and E31 and E32 extend along the width direction, the length of each of the first scan lines S11 to S1n and the first emission control lines E11 to E1n is longer than that of each of the second scan lines S21 and S22 and the second emission control lines E21 and E22. A difference in length between the scan lines S11 to S1n, S21 and S22, and S31 and S32 and a difference in length between the emission control lines E11 to E1n, E21 and E22, and E31 and E32 may cause a difference in respective load values between the scan lines S11 to S1n, S21 and S22, and S31 and S32 and a difference in respective load values between the emission control lines E11 to E1n, E21 and E22, and E31 and E32. That is, a load value of the first scan lines S11 to S1n may be greater than that of the second scan lines S21 and S22. In addition, a load value of the first emission control lines E11 to E1n may be greater than that of the second emission control lines E21 and E22. A voltage drop of the data signal may cause a difference in luminance between the first pixels PXL1 of the first pixel region PXA1 and the second pixels PXL2 of the second pixel region PXA2. In an embodiment of the present disclosure, the third pixels PXL3 of the third pixel region PXA3 may be provided in the same form as the second pixels PXL2, and therefore, a detailed description of the third pixels PXL3 will be omitted.

Figure 4:
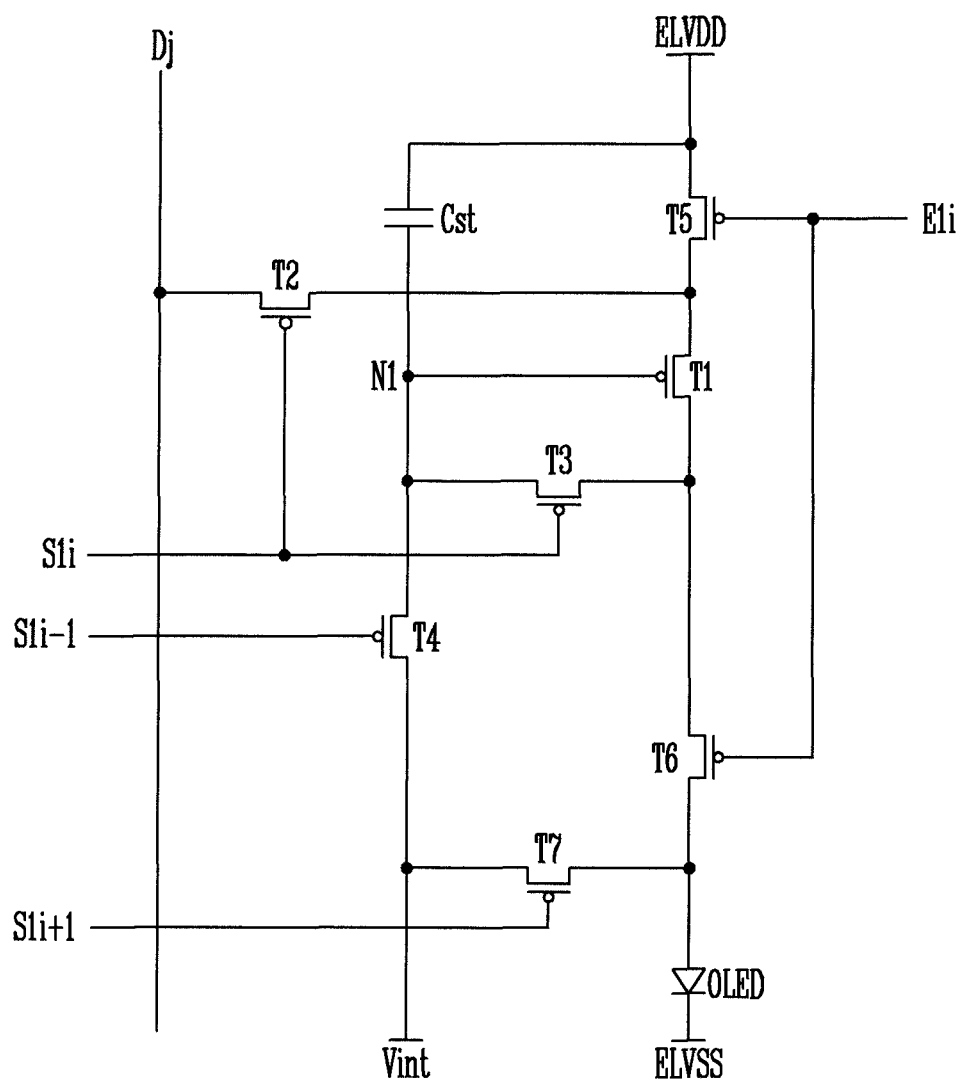
FIG. 4 is an equivalent circuit diagram illustrating an embodiment of a first pixel shown in FIG. 3.

FIG. 4 is an equivalent circuit diagram illustrating an embodiment of the first pixel shown in FIG. 3. For convenience of description, a pixel connected to a jth data line Dj, an (i−1)th first scan line S1i−1, an ith first scan line S1i, and an (i+1)th first scan line S1i+1 is illustrated in FIG. 4.

Referring to FIGS. 3 and 4, the first pixel PXL1 according to the embodiment of the present disclosure may include an organic light emitting device OLED, first to seventh transistors T1 to T7, and a storage capacitor Cst.

A first electrode of the organic light emitting device OLED may be connected to the first transistor T1 via the sixth transistor T6, and a second electrode of the organic light emitting device OLED may be connected to a second power source ELVSS. The organic light emitting device OLED may generate light with a predetermined luminance corresponding to the amount of current supplied from the first transistor T1.

A first power source ELVDD may be set to a voltage that is higher than that of the second power source ELVSS such that current can flow in the organic light emitting device OLED.

The seventh transistor T7 may be connected between an initialization power source Vint and the first electrode of the organic light emitting device OLED. In addition, a gate electrode of the seventh transistor T7 may be connected to the (i+1)th first scan line S1i+1. The seventh transistor T7 may be turned on when a scan signal is supplied to the (i+1)th first scan line S1i+1 to supply a voltage of the initialization power source Vint to the first electrode of the organic light emitting device OLED. Here, the initialization power source Vint may be set to a voltage that is lower than that of a data signal.

The sixth transistor T6 may be connected between the first transistor T1 and the organic light emitting device OLED. In addition, a gate electrode of the sixth transistor T6 may be connected to an ith first emission control line E1i. The sixth transistor T6 may be turned off when an emission control signal is supplied to the ith first emission control line E1i, and otherwise may be turned on.

The fifth transistor T5 may be connected between the first power source ELVDD and the first transistor T1. In addition, a gate electrode of the fifth transistor T5 may be connected to the ith first emission control line E1i. The fifth transistor T5 may be turned off when the emission control signal is supplied to the ith first light emitting control line E1i, and otherwise may be turned on.

A first electrode of the first transistor (drive transistor) T1 may be connected to the first power source ELVDD via the fifth transistor T5, and a second electrode of the first transistor T1 may be connected to the first electrode of the organic light emitting device OLED via the sixth transistor T6. In addition, a gate electrode of the first transistor T1 may be connected to a first node N1. The first transistor T1 may control the amount of current flowing from the first power source ELVDD to the second power source ELVSS via the organic light emitting device OLED, corresponding to a voltage of the first node N1.

The third transistor T3 may be connected between the second electrode of the first transistor T1 and the first node N1. In addition, a gate electrode of the third transistor T3 may be connected to the ith scan line S1i. The third transistor T3 may be turned on when the scan signal is supplied to the ith first scan line S1i to allow the second electrode of the first transistor T1 to be electrically connected to the first node N1. Therefore, the first transistor T1 may be diode-connected when the third transistor T3 is turned on.

The fourth transistor T4 may be connected between the first node N1 and the initialization power source Vint. In addition, a gate electrode of the fourth transistor T4 may be connected to the (i−1)th first scan line S1i−1. The fourth transistor T4 may be turned on when the scan signal is supplied to the (i−1)th first scan line S1i−1 to supply the voltage of the initialization power source Vint to the first node N1.

The second transistor T2 may be connected between the jth data line Dj and the first electrode of the first transistor T1. In addition, a gate electrode of the second transistor T2 may be connected to the ith first scan line S1i. The second transistor T2 may be turned on when the scan signal is supplied to the ith first scan line S1i to allow the jth data line Dj to be electrically connected to the first electrode of the first transistor T1.

The storage capacitor Cst may be connected between the first power source ELVDD and the first node N1. The storage capacitor Cst may store a voltage corresponding to the data signal and to a threshold voltage of the first transistor T1.

Meanwhile, each of the second and third pixels PXL2 and PXL3 may be implemented with the same circuit as the first pixel PXL1. Therefore, detailed descriptions of the second and third pixels PXL2 and PXL3 will be omitted.

Figure 5:
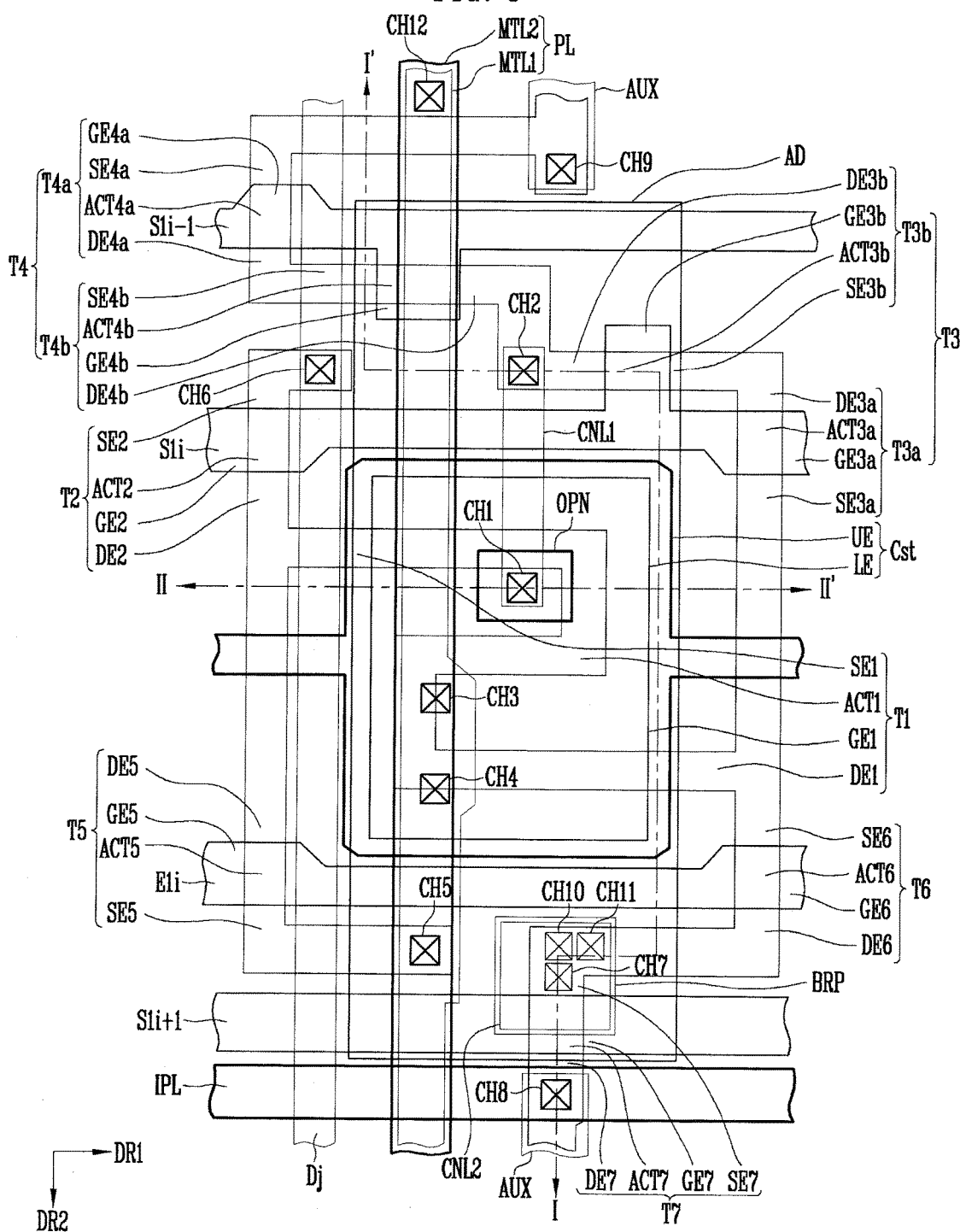
FIG. 5 is a plan view illustrating in detail the first pixel shown in FIG. 4.
Figure 6:
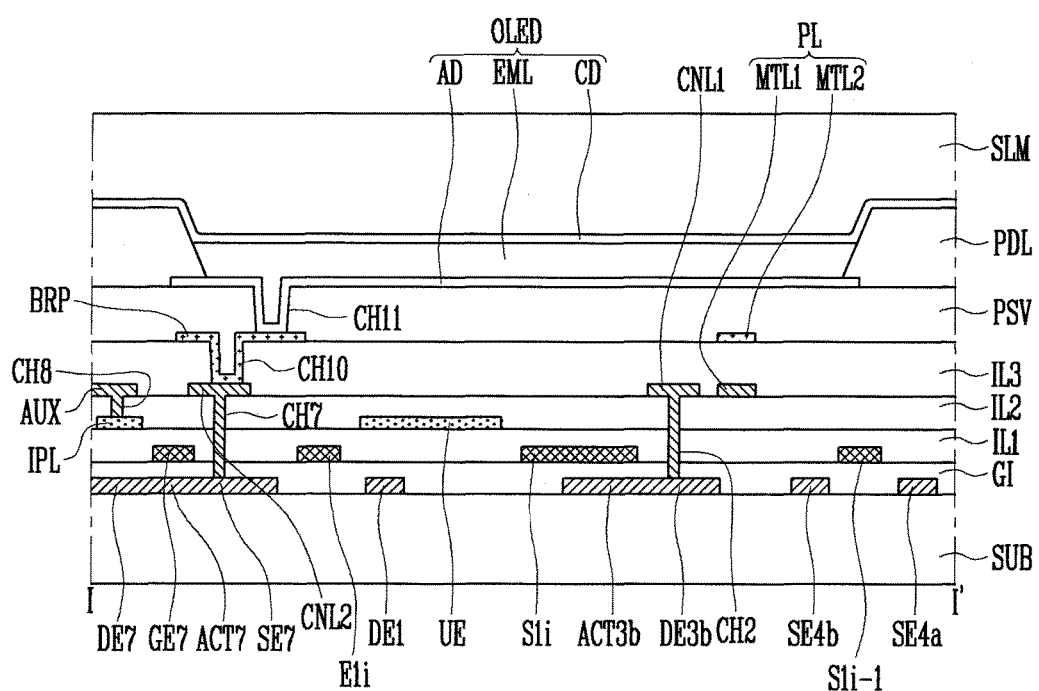
FIG. 6 is a sectional view taken along the line I-I' of FIG. 5.
Figure 7:
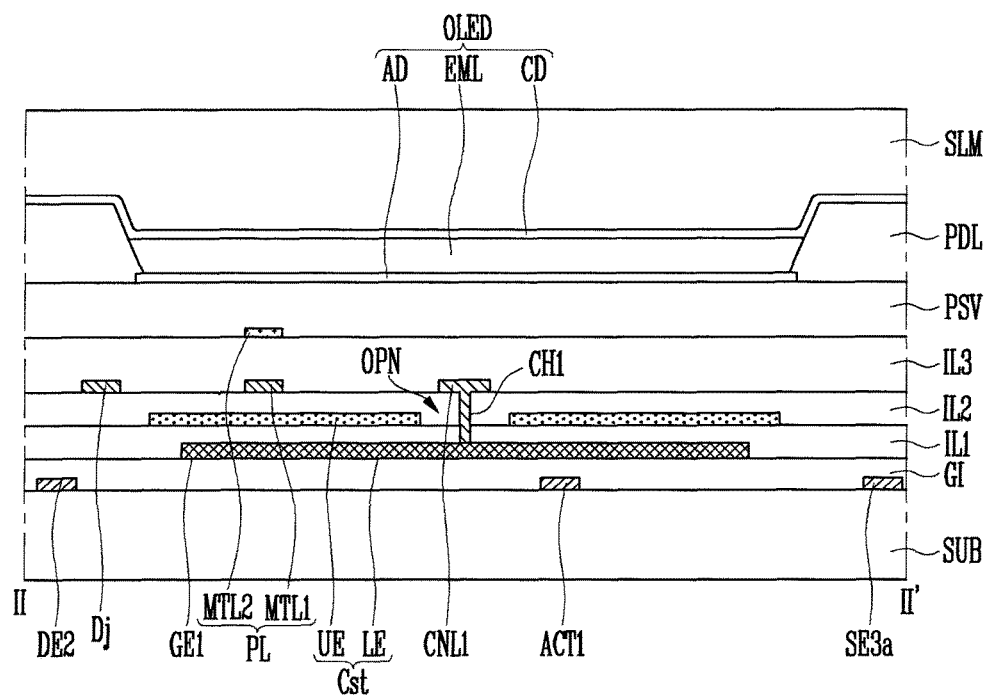
FIG. 7 is a sectional view taken along the line II-II' of FIG. 5.

FIG. 5 is a plan view illustrating in detail the first pixel shown in FIG. 4. FIG. 6 is a sectional view taken along the line I-I' of FIG. 5. FIG. 7 is a sectional view taken along the line II-II' of FIG. 5. Based on one first pixel PXL1 located on an ith row and a jth column in the first pixel region PXA1, three first scan lines S1i−1, S1i, and S1i+1, a first emission control line Eli, a power line PL, and a data line Dj, which are connected to the one first pixel PXL1, are illustrated in FIGS. 5 to 7. In FIGS. 5 to 7, for convenience of description, a first scan line on an (i−1)th row is referred to as an "(i−1)th first scan line S1$i$−1," a first scan line on the ith row is referred to as an "ith first scan line S1$i$," a first scan line on an (i+1)th row is referred to as an "(i+1)th first scan line S1$i$+1," a first emission control line on the ith row is referred to as a "first emission control line E1$i$," a data line on the jth column is referred to as a "data line Dj," and a power line on the jth column is referred to as a "power line PL."

Referring to FIGS. 4 to 7, the display device according to the embodiment of the present disclosure may include a substrate SUB, a line unit, and pixels (e.g., first pixels PXL1).

The substrate SUB may include a transparent insulating material to enable light to be transmitted therethrough.

The line unit provides signals to the first pixel PXL1, and may include the first scan lines S1$i$−1, S1$i$, and S1$i$+1, the data line Dj, the first light emitting control line E1$i$, the power line PL, and an initialization power line IPL.

The first scan lines S1$i$−1, S1$i$, and S1$i$+1 may extend in the first direction DR1. The first scan lines S1$i$−1, S1$i$, and S1$i$+1 may include an (i−1)th first scan line S1$i$−1, an ith first scan line S1$i$, and an (i+1)th scan line S1$i$+1, which are sequentially arranged along the second direction DR2. A scan signal may be applied to each of the first scan lines S1$i$−1, S1$i$, and S1$i$+1. For example, an (i−1)th scan signal may be applied to the (i−1)th first scan line S1$i$−1, an ith scan signal may be applied to the ith first scan line S1$i$, and an (i+1)th scan signal may be applied to the (i+1)th first scan line S1$i$+1.

In the present embodiment, the three first scan lines S1$i$−1, S1$i$, and S1$i$+1 have been illustrated as being able to provide the scan signal to each of the first scan lines S1$i$−1, S1$i$, and S1$i$+1, but the present disclosure is not limited thereto. For example, in the first pixel PXL, the scan signal may be applied through two first scan lines S1$i$−1 and S1$i$. In this case, an ith first scan line S1$i$ out of the two first scan lines S1$i$−1 and S1$i$ branches off into two lines, and the branching-off ith first scan line S1$i$ may be connected to different transistors. For example, the ith first scan line S1$i$ may include an upper ith first scan line adjacent to the (i−1)th first scan line S1$i$−1, and a lower ith first scan line that is more distant from the (i−1)th first scan line S1$i$−1 than the upper ith first scan line.

The first emission control line E1$i$ may extend in the first direction DR1. The first emission control line E1$i$ is spaced apart from the ith first scan line S1$i$ and the (i+1)th first scan line S1$i$+1, and is between the ith first scan line S1$i$ and the (i+1)th first scan line S1$i$+1. An emission control signal is applied to the first emission control line E1$i$.

The data line Dj may extend in the second direction DR2. A data signal may be applied to the data line Dj.

The power line PL may extend along the second direction DR2. The power line PL may be spaced apart from the data line Dj. A first power source (see ELVDD of FIG. 3) may be applied to the power line PL. The power line PL may be provided in a double layer including a first metal layer MTL1 and a second metal layer MTL2. The second metal layer MTL2 may be provided on the first metal layer MTL1 to overlap with the first metal layer MTL1 when viewed on a plane. The second metal layer MTL2 may be electrically connected to the first metal layer MTL1 through a twelfth contact hole CH12.

The initialization power line IPL may extend along the first direction DR1. The initialization power line IPL may be provided between the (i+1)th first scan line S1$i$+1 and an (i−1)th scan line S1$i$−1 on a next row. An initialization power source Vint may be applied to the initialization power line IPL.

The first pixel PXL1 may include first to seventh transistors T1 to T7, a storage capacitor Cst, and a light emitting device OLED.

The first transistor T1 may include a first gate electrode GE1, a first active pattern ACT1, a first source electrode SE1, a first drain electrode DE1, and a first connection line CNL1.

The first gate electrode GE1 may be connected to a third drain electrode DE3 of the third transistor T3 and a fourth drain electrode DE4 of the fourth transistor T4. The first connection line CNL1 may connect between the first gate electrode GE1 and the third and fourth drain electrodes DE3 and DE4. One end of the first connection line CNL1 may be connected to the first gate electrode GE1 through a first contact hole CH1, and the other end of the first connection line CNL1 may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer that is undoped and/or doped with impurities. For example, the first source electrode SE1 and the first drain electrode DE1 may be formed of a semiconductor layer doped with impurities, and the active pattern ACT1 may be formed of a semiconductor layer undoped with impurities.

The first active pattern ACT1 has a bar shape generally extending in an extending direction, and may have a shape in which it bends multiple times along the extending direction. The first active pattern ACT1 may overlap with the first gate electrode GE1 when viewed on a plane. As the first active pattern ACT1 is formed long, a channel region of the first transistor T1 can be formed long. Thus, the driving range of a gate voltage applied to the first transistor T1 is widened. Accordingly, the gray scale of light emitted from the light emitting device OLED can be minutely or precisely controlled.

The first source electrode SE1 may be connected to one end of the first active pattern ACT1. The first source electrode SE1 may be connected to a second drain electrode DE2 of the second transistor T2 and to a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the ith first scan line S1$i$. The second gate electrode GE2 may be provided as a portion of the ith first scan line S1$i$, or may be provided in a shape protruding from the ith first scan line S1$i$. In an embodiment of the present disclosure, the second active pattern ACT2, the second source electrode SE2, and the second drain electrode DE2 may be formed of a semiconductor that is undoped and/or doped with impurities. For example, the second source electrode SE2 and the second drain electrode DE2 may be formed of a semiconductor layer that is doped with impurities, and the second active pattern ACT2 may be formed of a semiconductor layer that is undoped with impurities. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3a, a 3bth source electrode SE3b, and a 3bth drain electrode DE3b. Hereinafter, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as the third source electrode SE3, and the 3ath drain electrode DE3a and the 3bth drain electrode DE3b are referred to as the third drain electrode DE3.

The third gate electrode GE3 may be connected to the ith first scan line S1i. The third gate electrode GE3 may be provided as a portion of the ith first scan line S1i, or may be provided in a shape protruding from the ith first scan line S1i.

The third active pattern ACT3, the third source electrode SE3, and the third drain electrode DE3 may be formed of a semiconductor layer that is undoped and/or doped with impurities. For example, the third source electrode SE3 and the third drain electrode DE3 may be formed of a semiconductor layer doped with impurities, and the third active pattern ACT3 may be formed of a semiconductor layer undoped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and to the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the first connection line CNL1, the second contact hole CH2, and the first contact hole CH1.

The fourth transistor T4 may be provided in a double gate structure so as to prevent or reduce a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a. The 4bth transistor T4b may include a 4bth gate electrode GE4b, a 4bth active pattern ACT4b, a 4bth source electrode SE4b, and a 4bth drain electrode DE4b. Hereinafter, the 4ath gate electrode GE4a and the 4bth gate electrode GE4b are referred to as a fourth gate electrode GE4, the 4ath active pattern ACT4a and the 4bth active pattern ACT4b are referred to as a fourth active pattern ACT4, the 4ath source electrode SE4a and the 4bth source electrode SE4b are referred to as a fourth source electrode SE4, and the 4ath drain electrode DE4a and the 4bth drain electrode DE4b are referred to as the fourth drain electrode DE4.

The fourth gate electrode GE4 may be connected to the (i−1)th first scan line S1i−1. The fourth gate electrode GE4 may be provided as a portion of the (i−1)th first scan line S1i−1 or may be provided in a shape protruding from the (i−1)th first scan line S1i−1.

The fourth active pattern ACT4, the fourth source electrode SE4, and the fourth drain electrode DE4 may be formed of a semiconductor layer that is undoped and/or doped with impurities. For example, the fourth source electrode SE4 and the fourth drain electrode DE4 may be formed of a semiconductor layer doped with impurities, and the fourth active pattern ACT4 may be formed of a semiconductor layer undoped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a first pixel PXL1 on an (i−1)th row and to a seventh drain electrode DE7 of a seventh transistor T7 of the first pixel PXL1 on the (i−1)th row. An auxiliary connection line AUX may be provided between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to an initialization power line IPL on the (i−1)th row through an eighth contact hole CH8 of the first pixel PXL1 on the (i−1)th row. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the first connection line CNL1, the second contact hole CH2, and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the first emission control line E1i. The fifth gate electrode GE5 may be provided as a portion of the first emission control line E1i, or may be provided in a shape protruding from the first emission control line E1i. The fifth active pattern ACT, the fifth source electrode SE5, and the fifth drain electrode DE5 may be formed of a semiconductor layer that is undoped and/or doped with impurities. For example, the fifth source electrode SE5 and the fifth drain electrode DE5 may be formed of a semiconductor layer that is doped with impurities, and the fifth active pattern ACT5 may be formed of a semiconductor layer that is undoped. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and to the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the first emission control line E1i. The sixth gate electrode SE6 may be provided as a portion of the first emission control line E1$i$, or may protrude from the first emission control line E1$i$. The sixth active pattern ACT6, the sixth source electrode SE6, and the sixth drain electrode DE6 may be formed of a semiconductor layer that is undoped and/or doped with impurities. For example, the sixth source electrode SE6 and the sixth drain electrode DE6 may be formed of a semiconductor layer doped with impurities, and the sixth active pattern ACT6 may be formed of a semiconductor layer that is undoped. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and the seventh drain electrode DE7.

The seventh gate electrode GE7 may be connected to the (i+1)th first scan line S1$i$+1. The seventh gate electrode GE7 may be provided as a portion of the (i+1)th first scan line S1$i$+1, or may extend from the (i+1)th first scan line S1$i$+1. The seventh active pattern ACT7, the seventh source electrode SE7, and the seventh drain electrode DE7 may be formed of a semiconductor layer that is undoped or doped with impurities. For example, the seventh source electrode SE7 and the seventh drain electrode DE7 may be formed of a semiconductor layer doped with impurities, and the seventh active layer ACT7 may be formed of as an undoped semiconductor layer. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a first pixel PXL on an (i+1)th row. The seventh drain electrode DE7 may be connected to the fourth source electrode SE4 of the fourth transistor T4 of the first pixel PXL on the (i+1)th row through the auxiliary connection line AUX, the eighth contact hole CH8, and the ninth contact hole CH9.

The storage capacitor Cst may include a lower electrode LE and an upper electrode UE. The lower electrode LE may be configured as the first gate electrode GE1 of the first transistor T1.

The upper electrode UE overlaps with the first gate electrode GE1, and may cover the lower electrode LE when viewed on a plane. As the overlapping area of the upper electrode UE and the lower electrode LE increases, the capacitance of the storage capacitor Cst may also increase. The upper electrode UE may extend in the first direction DR1. In an embodiment of the present disclosure, a voltage having the same level as the second power source ELVDD may be applied to the upper electrode UE. The upper electrode UE may have an opening OPN in a region including the first contact hole CH1 through which the first gate electrode GE1 and the first connection line CNL1 are connected to each other.

The light emitting device OLED may include a first electrode AD, a second electrode CD, and an emitting layer EML between the first electrode AD and the second electrode CD.

The first electrode AD may be provided in a light emitting region corresponding to each first pixel PXL1. The first electrode AD may be connected to the seventh source electrode SE7 of the seventh transistor T7 and the sixth drain electrode DE6 of the sixth transistor T6 through a seventh contact hole CH7 and a tenth contact hole CH10. A second connection line CNL2 and a bridge pattern BRP may be provided between the seventh contact hole CH7 and the tenth contact hole CH10 to connect the first electrode AD to the sixth drain electrode DE6 and the seventh source electrode SE7.

Hereinafter, a structure of the display device according to the embodiment of the present disclosure will be described along a stacking order with reference to FIGS. 5 to 7.

The active patterns ACT1 to ACT7 (hereinafter, referred to as "ACT") may be provided on the substrate SUB. The active patterns ACT may include the first to seventh active patterns ACT1 to ACT7. The first to seventh active patterns ACT1 to ACT7 may be formed of a semiconductor material.

A buffer layer may be provided between the substrate SUB and the active patterns ACT.

A gate insulating layer GI may be provided on the substrate SUB on which the active patterns ACT are formed.

The first scan lines S1$i$-1, S1$i$, and S1$i$+1, the light emission line E1$i$, and the first to seventh gate electrodes GE1 to GE7 may be provided on the gate insulating layer GI. The first gate electrode GE1 may be the lower electrode LE of the storage capacitor Cst. The second gate electrode GE2 and the third gate electrode GE3 may be integrally formed with the ith first scan line S1$i$. The fourth gate electrode GE4 may be integrally formed with the (i−1)th first scan line S1$i$−1. The fifth gate electrode GE5 and the sixth gate electrode GE6 may be integrally formed with the emission control line E1$i$. The seventh gate electrode GE7 may be integrally formed with the (i+1)th first scan line S1$i$+1.

A first insulating layer IL1 may be provided on the substrate SUB on which the first scan lines S1$i$−1, S1$i$, and S1$i$+1 and the like are formed.

The upper electrode UE of the storage capacitor Cst and the initialization power line IPL may be provided on the first insulating layer IL1. The upper electrode UE may cover the lower electrode LE. The upper electrode UE along with the lower electrode LE may constitute the storage capacitor Cst with the first insulating layer IL1 interposed therebetween.

A second insulating layer IL2 may be provided on the substrate SUB above the upper electrode UE and the initialization power line IPL.

The data line Dj, the first metal layer MTL1 of the power line PL, the first and second contact lines CNL1 and CNL2, and the auxiliary connection line AUX may be provided on the second insulating layer IL2.

The data line Dj may be connected to the second source electrode SE2 through the sixth contact hole CH6 sequentially passing through the gate insulating layer GI and the first and second insulating layers IL1 and IL2.

The first metal layer MTL1 of the power line PL may be connected to the upper electrode UE of the storage capacitor Cst through third and fourth contact holes CH3 and CH4 passing through the second insulating layer IL2. Also, the first metal layer MTL1 of the power line PL may be connected to the fifth source electrode SE5 through the fifth contact hole CH5 sequentially passing through the gate insulating layer GI and the first and second insulating layers IL1 and IL2.

The first connection line CNL1 may be connected to the first gate electrode GE1 through the first contact hole CH1 sequentially passing through the first and second insulating layers IL1 and IL2. Also, the first connection line CNL1 may be connected to a third drain electrode DE3 and a fourth drain electrode DE4 through the second contact hole CH2 sequentially passing through the gate insulating layer GI and the first and second insulating layers IL1 and IL2.

The second connection line CNL2 may be a pattern provided as a medium connecting the sixth drain electrode DE6 and the first electrode AD to each other. The second connection line CNL2 may be connected to the sixth drain electrode DE6 and the seventh source electrode SE7 through the seventh contact hole CH7 sequentially passing through the gate insulating layer GI and the first and second insulating layers IL1 and IL2.

The auxiliary connection line AUX may be connected to the initialization power line IPL through the eighth contact hole CH8 passing through the second insulating layer IL2. Also, the auxiliary connection line AUX may be connected to the fourth source electrode SE4 and the seventh drain electrode DE7 of the first pixel PXL1 on the (i−1)th row through the ninth contact hole CH9 sequentially passing through the gate insulating layer GI and the first and second insulating layers IL1 and IL2.

A third insulating layer IL3 may be provided on the substrate SUB above the data line Dj and the like.

The bridge pattern BRP and the second metal layer MTL2 of the power line PL may be provided on the third insulating layer IL3.

The bridge pattern BRP may be connected to the second connection line CNL2 through the tenth contact hole CH10 passing through the third insulating layer IL3.

The second metal layer MTL2 of the power line PL may be connected to the first metal layer MTL1 through the twelfth contact hole CH12 passing through the third insulating layer IL3.

A protective layer PSV may be provided on the substrate SUB above the bridge pattern BRP and the like.

The first electrode AD may be provided on the protective layer PSV. The first electrode AD may be connected to the bridge pattern BRP through an eleventh contact hole CH11 passing through the protective layer PSV. Because the bridge pattern BRP is connected to the second connection line CNL2 through the tenth contact hole CH10, the first electrode AD may be finally connected to the sixth drain electrode DE6 and the seventh source electrode SE7 through the bridge pattern BRP and the second connection line CNL2.

A pixel defining layer PDL defining a first pixel region to correspond to each first pixel PXL1 may be provided on the substrate SUB above the first electrode AD. The pixel defining layer PDL exposes a top surface of the first electrode AD, and may protrude along a circumference or perimeter of the first pixel PXL1.

The emitting layer EML may be provided in the first pixel region PXA1 surrounded by the pixel defining layer PDL, and the second electrode CD may be provided on the emitting layer EML.

An encapsulation layer SLM covering the second electrode CD may be provided over the second electrode CD.

The encapsulation layer SLM may reduce or prevent oxygen and moisture from penetrating into the organic light emitting device OLED. The encapsulation layer SLM may include an inorganic layer. The inorganic layer may include at least one selected from the group consisting of silicon oxide, silicon nitride, silicon oxynitride, aluminum oxide, titanium oxide, zirconium oxide, and tin oxide. The encapsulation layer SLM covers first to third pixel regions (see PXA1, PXA2, and PXA3 of FIG. 1) of first to third regions (see A1 to A3 of FIG. 1), and may extend up to the outside of the first to third pixel regions PXA1, PXA2, and PXA3.

In an embodiment of the present disclosure, the second pixel (see PXL2 of FIG. 1) provided in the second pixel region PXA2 and the third pixel (see PXL3 of FIG. 1) provided in the third pixel region PXA3 have the substantially same pixel structure as the first pixel PXL1, and therefore, their descriptions will be omitted.

Figure 8B:
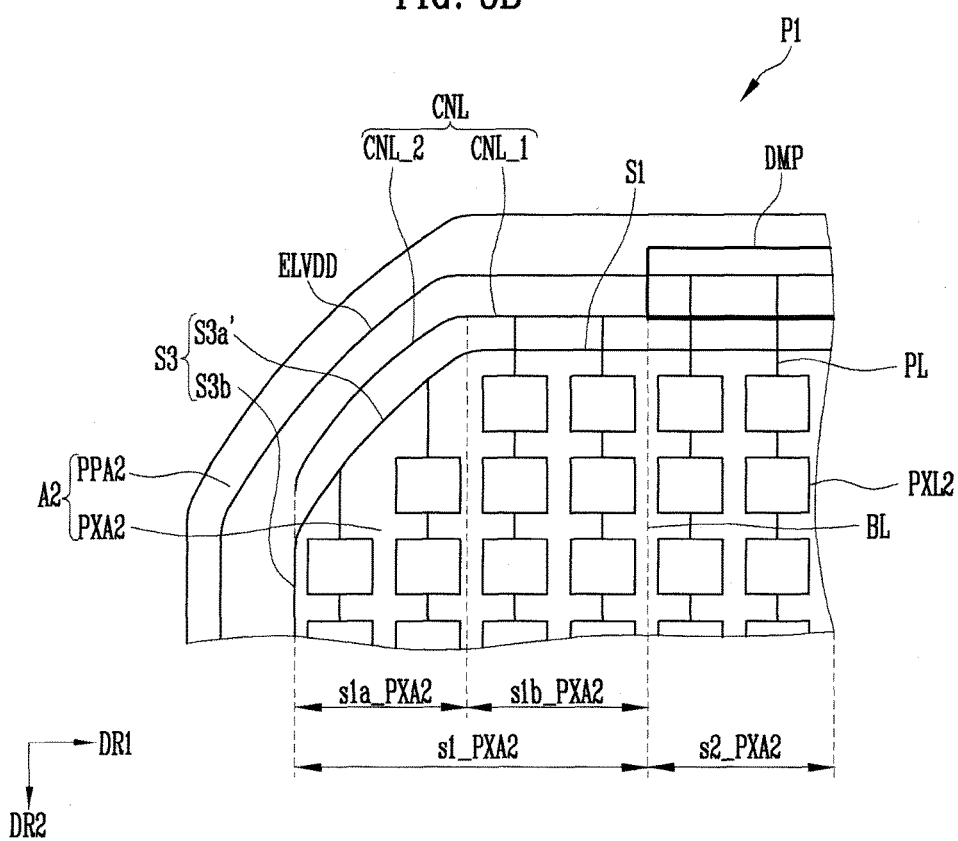
Figure 8C:
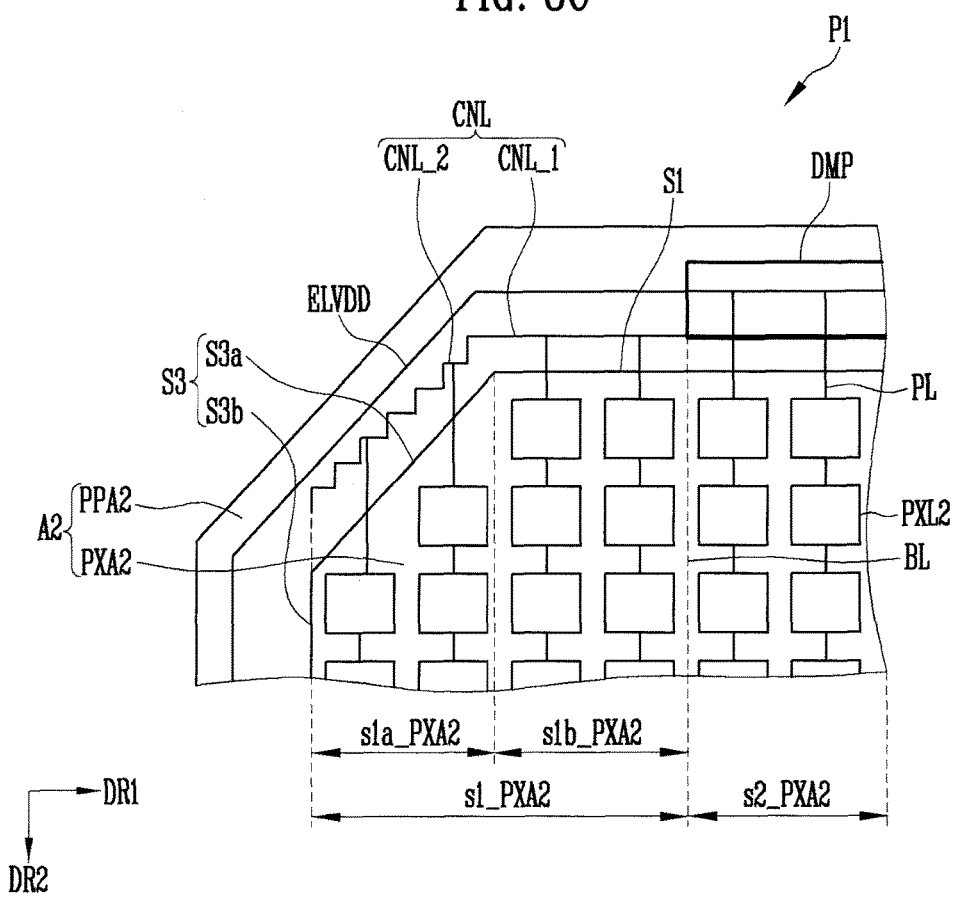

FIGS. 8A to 8C are plan views conceptually illustrating a portion corresponding to the area P1 of FIG. 1. For convenience of description, an arrangement relationship of a dummy part DMP, a first power supply line ELVDD, a plurality of second pixels PXL2, and a connection line CNL in the second region is mainly illustrated in FIGS. 8A to 8C.

Referring to FIGS. 1 and 8A, the display device according to the embodiment of the present disclosure may include a substrate SUB having first to third regions A1, A2, and A3.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate.

In addition, the substrate SUB may be a flexible substrate. Here, the substrate SUB may be one of a film substrate including a polymer organic material and a plastic substrate. For example, the substrate SUB may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and may include a fiber reinforced plastic (FRP), etc.

The second region A2 may include a second pixel region PXA2, in which a plurality of second pixels PXL2 are provided, and a second peripheral region PPA2 at at least one side of the second pixel region PXA2. The second pixels PXL2 may include a plurality of pixel rows each arranged in a first direction DR1, and the pixel rows may be arranged to extend along a second direction DR2 perpendicular to the first direction DR1. The second pixels PXL2 may be arranged to extend along the first direction DR1. That is, the second pixels PXL2 may be arranged in a matrix form.

The second pixel region PXA2 may include a pair of lateral sides S1 and S2 extending along the first direction DR1, and a pair of longitudinal sides S3 and S4 extending along the second direction DR2. The pair of longitudinal sides S3 and S4 may partially include an inclined oblique line. Here, the pair of longitudinal sides S3 and S4 may include a first longitudinal side S3 and a second longitudinal side S4, which face each other.

The first longitudinal side S3 may be configured with an oblique line S3a and a straight line S3b, but the present disclosure is not limited thereto. For example, the first longitudinal side S3 may be configured with only the oblique line S3a, or may be configured with only the straight line S3b. In some embodiments, the first longitudinal side S3, as shown in FIG. 8B, may be configured with a curved line S3a' and the straight line S3b.

The first longitudinal side S3 forms a corner portion of the second pixel region PXA2 by meeting a first lateral side S1 out of the pair of lateral sides S1 and S2, and may be connected to a longitudinal side of a first pixel region PXA1 of the first region A1.

The second longitudinal side S4 may also be configured with an oblique line and a straight line, but the present disclosure is not limited thereto. For example, the second longitudinal side S4 may be configured with only the straight line.

The second pixel region PXA2 may include a first sub-region s1_PXA2 and a second sub-region s2_PXA2. In an embodiment of the present disclosure, the second pixel region PXA2 may be divided into the first sub-region s1_PXA2 and the second sub-region s2_PXA2 based on a virtual line BL extending along the second direction DR2 ad corresponding to an end of a dummy part DMP.

The second sub-region s2_PXA2 may be a region corresponding to the dummy part DMP located in the second peripheral region PPA2. The first sub-region s1_PXA2 is a region not corresponding to the dummy part DMP, and may be a region in which second pixels PXL2 are adjacent to the first longitudinal side S3. The first sub-region s1_PXA2 and the second sub-region s2_PXA2 may have shapes different from each other.

The first sub-region s1_PXA2 may be divided into a (1-1)th sub-region s1a_PXA2 and a (1-2)th sub-region s1b_PXA2 based on an arbitrary line extending along the second direction DR2 at a corner portion at which the first lateral side S1 and the first longitudinal side S3 meet each other. The (1-1)th sub-region s1a_PXA2 may be a region corresponding to the first longitudinal side S3 of the second pixel region PXA2, and the (1-2)th sub-region s1b_PXA2 may be a region corresponding to the first lateral side S1 of the second pixel region PXA2.

When viewed on a plane, the shape of the (1-1)th sub-region s1a_PXA2 may be different from that of the (1-2)th sub-region s1b_PXA2. Specifically, the (1-1)th sub-region s1a_PXA2 may have a quadrangular shape defined by the oblique line S3a and the straight ling S3b of the first longitudinal line S3, a second lateral line S2, and the arbitrary line. Therefore, a number of the second pixels PXL2 located in the (1-1)th sub-region s1a_PXA2 may be different from that of the second pixels PXL2 located in the (1-2)th sub-region s1b_PXA2. In this case, the second pixels PXL2 located in the (1-1)th sub-region s1a_PXA2 may be pixels located most adjacent to the first longitudinal side S3 at the outermost side of the second pixel region PXA2.

A first power supply line ELVDD, the dummy part DMP, and a connection line CNL may be provided in the second peripheral region PPA2. The dummy part DMP may compensate for a difference in load values between pixel regions PXA. A detailed description of the dummy part DMP will be described later with reference to FIG. 10.

The first power supply line ELVDD may be located in the second peripheral region PPA2, and may surround an edge of the connection line CNL. The first power supply line ELVDD may provide a first power source to the second pixels PXL2 through power lines PL. The first power supply line ELVDD may be integrally provided with the dummy part DMP to be connected to the dummy part DMP. The power line PL corresponding to each of the pixel columns of the second pixels PXL2 may be connected to the respective pixel column. Each of the power lines PL may be connected to all of the second pixels PXL2 provided on the respective pixel column, and the second pixels PXL2 on a same column may share the same power line PL.

The first power supply line ELVDD may be provided in a shape corresponding to the outer shape of the second pixel region PXA2 and to the shape of the second peripheral region PPA2. In other embodiments, the first power supply line ELVDD may correspond to the outer shape of the second pixel region PXA2.

The first power supply line ELVDD, as shown in the drawings, may include a lateral part, which corresponds to the first lateral side S1 of the second pixel region PXA2, and a longitudinal part, which corresponds to the first longitudinal side S3. The longitudinal part of the first power supply line ELVDD may include an inclined oblique part. In some embodiments, the longitudinal part of the first power supply line ELVDD may include a bent curved part corresponding to the curved line S3a' of the first longitudinal side S3 when the first longitudinal side S3 includes the curved line S3a', as shown in FIG. 8B.

The connection line CNL may extend along the first direction DR1 from the dummy part DMP, and may be electrically connected to the dummy part DMP. As shown in the drawings, the connection line CNL may include a first part CNL_1, which corresponds to the lateral part of the first power supply line ELVDD, and a second part CNL_2, which corresponds to a portion of the longitudinal part of the first power supply line ELVDD. Particularly, the second part CNL_2 of the connection line CNL may include an inclined oblique part. In some embodiments, the second part CNL_2 of the connection line CNL may include a bent curved part corresponding to the curved line S3a' of the first longitudinal side S3 when the first longitudinal side S3 includes the curved line S3a', as shown in FIG. 8B. In addition, the second part CNL_2 of the connection line CNL, as shown in FIG. 8C, may include a step shape having a stepped part.

In an embodiment of the present disclosure, the second pixels PXL2 located in the (1-1)th sub-region s1a_PXA2 may be electrically connected to the second part CNL_2 of the connection line CNL, and the second pixels PXL2 located in the (1-2)th sub-region s1b_PXA2 may be electrically connected to the first part CNL_1 of the connection line CNL.

Meanwhile, the dummy part DMP, as described above, may be directly connected to the second pixels PXL2 located in the second sub-region s2_PXA2 through the power line PL. Consequently, as the second pixels PXL2 located in the second sub-region s2_PXA2 are directly connected to the dummy part DMP, the second pixels PXL2 located in the second sub-region s2_PXA2 can be finally connected to the first power supply line ELVDD.

The second pixels PXL2 located in the first sub-region s1_PXA2 not corresponding to the dummy part DMP may be connected to the connection line CNL. Accordingly, as the second pixels PXL2 located in the first sub-region s1_PXA2 are connected to the dummy part DMP through the connection line CNL, the second pixels PXL2 located in the first sub-region s1_PXA2 can be finally connected to the first power supply line ELVDD. As described above, because the first sub-region s1_PXA2 not corresponding to the dummy part DMP is electrically connected to the dummy part DMP through the connection line CNL, a first power source applied to the first power supply line ELVDD may be provided to even the first sub-region s1_PXA2. Thus, the first power source can be uniformly provided to the first sub-region s1_PXA2 and the second sub-region s2_PXA2.

Figure 9A:
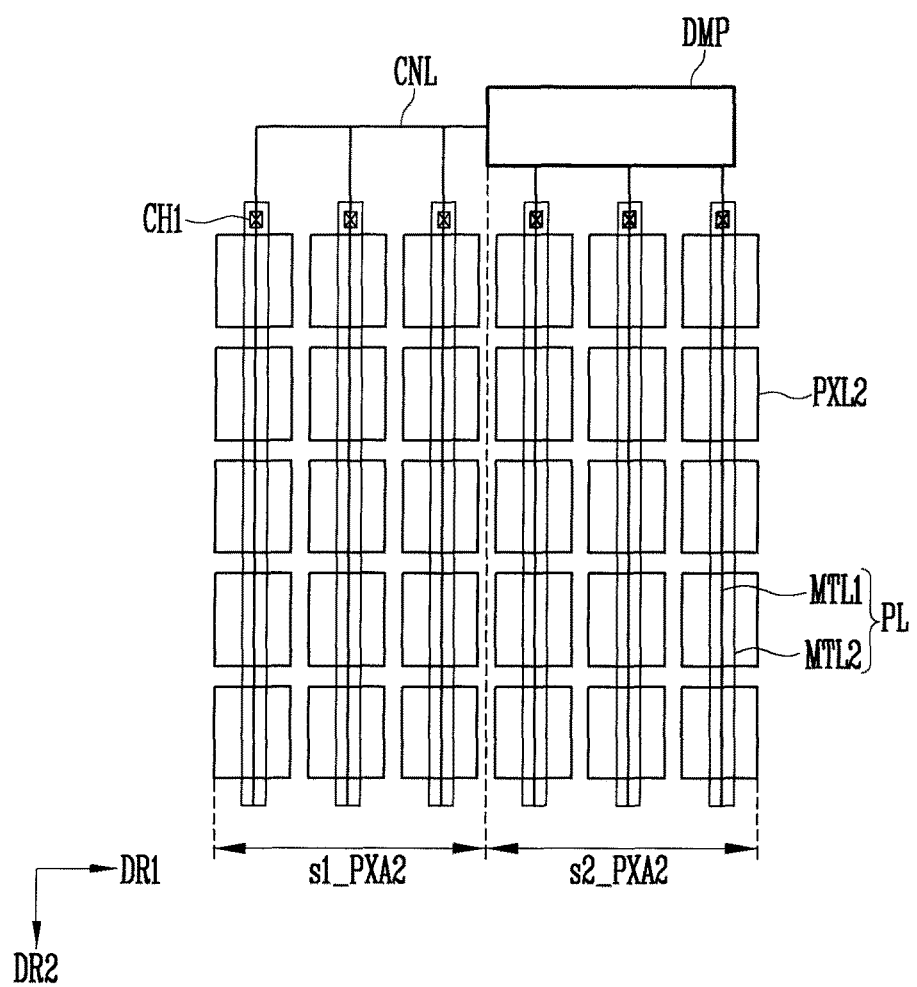
FIGS. 9A to 9C are plan views conceptually illustrating a connection relationship of a dummy part, second pixels, and a connection line in a second region of FIG. 8A.
Figure 9B:
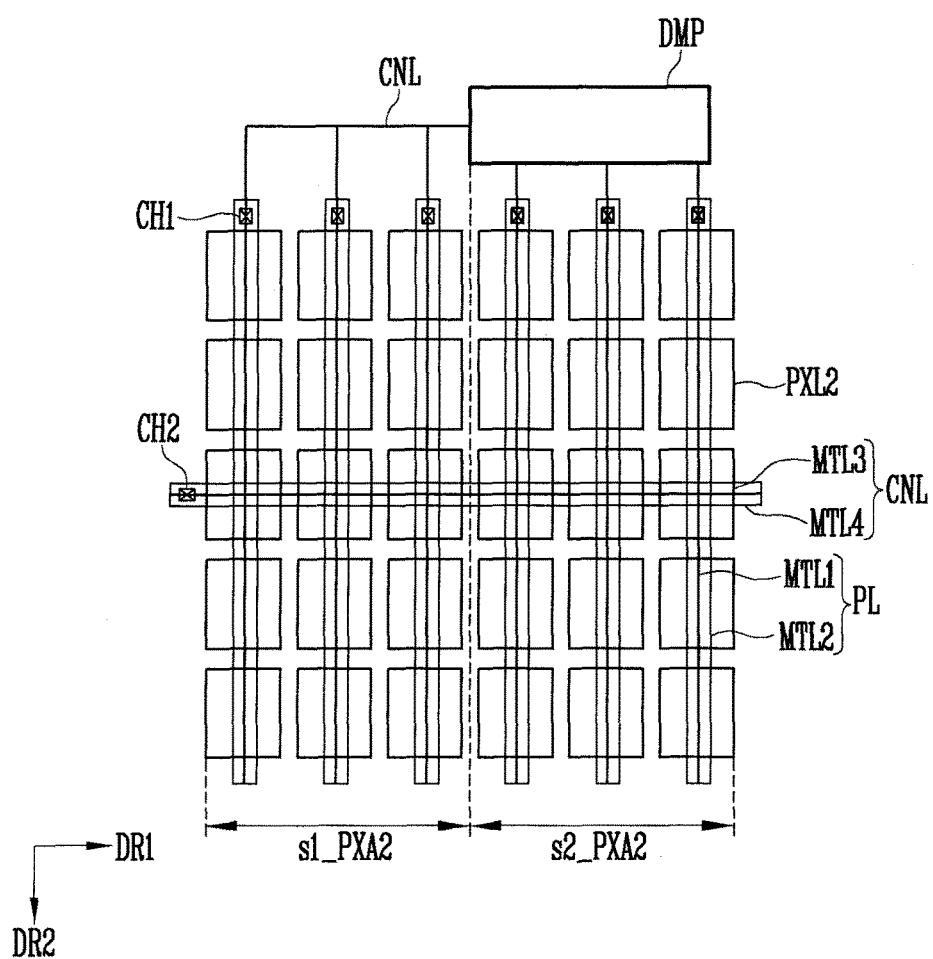
Figure 9C:
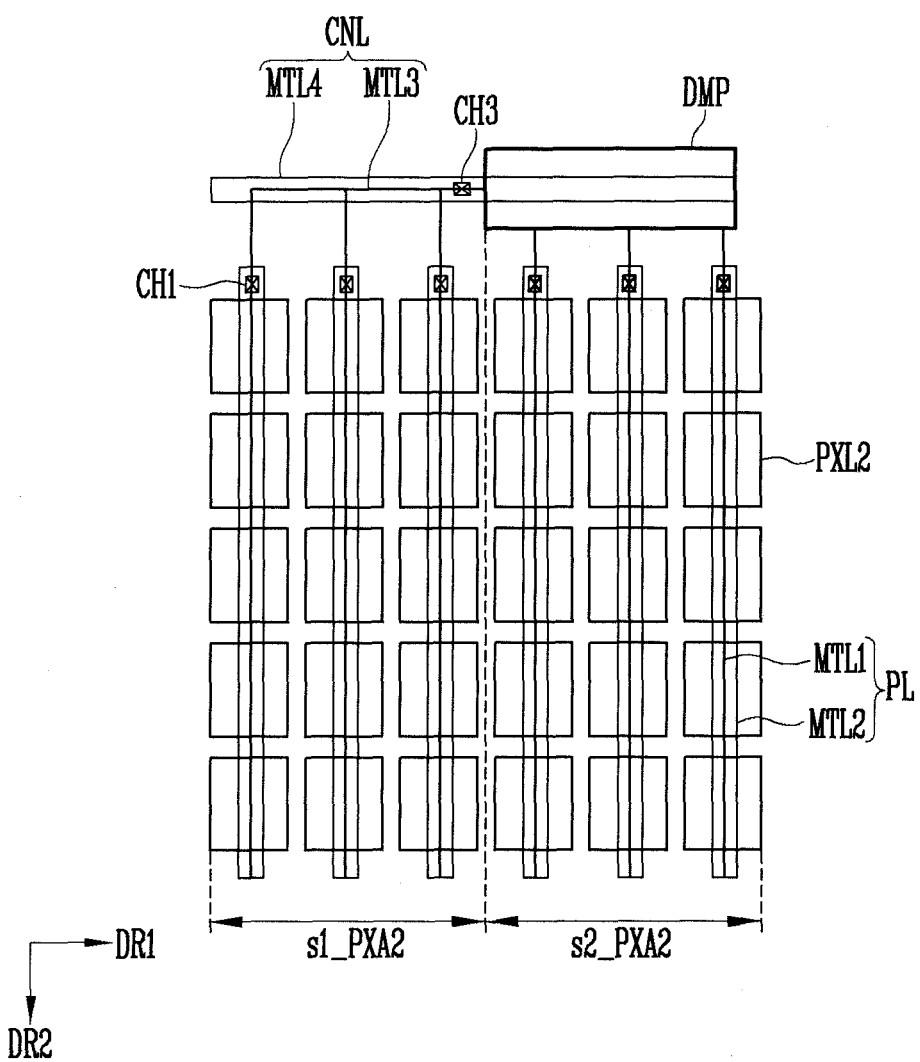

FIGS. 9A to 9C are plan views conceptually illustrating a connection relationship of a dummy part, second pixels, and a connection line in the second region of FIG. 8A.

Referring to FIGS. 8A and 9A, a second region A2 may include a second pixel region PXA2 in which a plurality of second pixels PXL2 are provided, and a second peripheral region PPA2 provided at the periphery of the second pixel region PXA2. A dummy part DMP and a connection line CNL may be provided in the second peripheral region PPA2.

The second pixel region PXA2 may include a first sub-region s1_PXA2 not corresponding to the dummy part DMP, and a second sub-region s2_PXA2 corresponding to the dummy part DMP.

In an embodiment of the present disclosure, the second pixels PXL2 may be arranged in a matrix form along pixel rows extending in a first direction DR1 and pixel columns extending along the second direction DR2. However, the arrangement form of the second pixels PXL2 is not particularly limited, and the second pixels PXL2 may be arranged in various forms. For example, the second pixels PXL2 may be arranged such that the one direction becomes a row direction, or may be arranged such that a direction oblique to the one direction becomes a row direction. Hereinafter, for convenience of description, the second pixels PXL2 located in the first sub-region s1_PXA2 are referred to as a (2-1)th pixel PXL2, and the second pixels PXL2 located in the second sub-region s2_PXA2 are referred to as a (2-2)th pixel PXL2.

Power lines PL corresponding to the pixel columns of the second pixels PXL2 may be connected to the pixel columns of the second pixels PXL2, respectively. Each of the power lines PL may be connected to all of the second pixels PXL2 provided on each pixel column, and the second pixels PXL2 on the same column may share the same power line PL. Hereinafter, the power line PL connected to the (2-1)th pixel PXL2 is referred to as a first power line PL, and the power line connected to the (2-2)th pixel PXL2 is referred to as the second power line PL.

Each of the first and second power lines PL may be provided in a double layer including a first metal layer MTL1, and a second metal layer MTL2 located on the first metal layer MTL1, with an insulating layer interposed therebetween. The first metal layer MTL1 and the second metal layer MTL2 may be electrically connected to each other through a first contact hole CH1 provided in the insulating layer. In an embodiment of the present disclosure the first and second metal layers MTL1 and MTL2 may have widths different from each other, but the present disclosure is not limited thereto. For example, the first metal layer MTL1 may have a width equal to that of the second metal layer MTL2.

The first metal layer MTL1 of the second power line PL may be integrally provided with the dummy part DMP to be electrically connected to the dummy part DMP. The first metal layer MTL1 of the first power line PL may be integrally provided with the connection line CNL to be electrically connected to the connection line CNL.

The connection line CNL may extend along the first direction DR1 from the dummy part DMP, and may be located in the second peripheral region PPA2 to correspond to the first sub-region s1_PXA2. The connection line CNL may be integrally provided with the first metal layer MTL1 of the first power line PL connected to the (2-1)th pixel PXL2. Also, the connection line CNL may be integrally provided with the dummy part DMP. Therefore, the (2-1)th pixel PXL2 may be connected to the dummy part DMP through the connection line CNL.

In some embodiments, the connection line CNL, as shown in FIG. 9C, may be provided in a double layer including a third metal layer MTL3 and a fourth metal layer MTL4 located on the third metal layer MTL3. The third metal layer MTL3 and the fourth metal layer MTL4 may be electrically connected to each other through a third contact hole CH3 provided in the insulating layer. In this case, the third metal layer MTL3 may be integrally provided with the first metal layer MTL1 of the first power line PL connected to the (2-1)th pixel PXL2. Therefore, the connection line CNL may be connected to the (2-1)th pixel PXL. In addition, the third metal layer MTL3 may be integrally provided with the dummy part DMP to be electrically connected to the dummy part DMP.

In an embodiment of the present disclosure, the power line PL located in the first sub-region s1_PXA2, the power line PL located in the second sub-region s2_PXA2, the connection line CNL, and the dummy part DMP may form a mesh structure when viewed on a plane.

Referring to FIGS. 8A and 9B, a second region A2 may include a second pixel region PXA2 in which a plurality of second pixels PXL2 are provided, and a second peripheral region PPA2 provided at the periphery of the second pixel region PXA2. A dummy part DMP may be provided in the second peripheral region PPA2.

The second pixel region PXA2 may include a first sub-region s1_PXA2 not corresponding to the dummy part DMP, and a second sub-region s2_PXA2 corresponding to the dummy part DMP.

Power lines PL corresponding to pixel columns of the second pixels PXL2 may be connected to the pixel columns of the second pixels PXL2, respectively. The second pixels PXL2 located in the second sub-region s2_PXA2 may be connected to the dummy part DMP through the power lines PL. Each of the power lines PL may be provided in a double layer including a first metal layer MTL1, and a second metal layer MTL2 located on the first metal layer MTL1. The first metal layer MTL1 and the second metal layer MTL1 may be electrically connected to each other through a first contact hole CH1 provided in an insulating layer.

A connection line CNL extending along the second direction DR2 may be provided in the second pixel region PXA2. That is, the connection line CNL may be provided throughout the first and second sub-regions s1_PXA2 and s2_PXA2.

The connection line CNL may be provided in a double layer including a third metal layer MTL3, and a fourth metal layer MTL4 located on the third metal layer MTL3. The third metal layer MTL3 and the fourth metal layer MTL4 may be electrically connected to each other through a second contact hole CH2 provided in the insulating layer.

The third metal layer MTL3 may be integrally provided with the first metal layer MTL1 to be electrically connected to the first metal layer MTL1. In addition, the fourth metal layer MTL4 may be integrally provided with the second metal layer MTL2 to be electrically connected to the second metal layer MTL2. That is, the connection line CNL may be electrically connected to the power line PL located in the second sub-region s2_PXA2. Consequently, the connection line CNL may be electrically connected to the dummy part DMP through the power line PL located in the second sub-region s2_PXA2. Therefore, the second pixels PXL2 located in the first sub-region s1_PXA2 not corresponding to the dummy part DMP may be connected to the dummy part DMP through the connection line CNL.

In an embodiment of the present disclosure, the power line PL located in the first sub-region s1_PXA2, the power line PL located in the second sub-region s2_PXA2, the connection line CNL, and the dummy part DMP may form a mesh structure when viewed on a plane.

Figure 10:
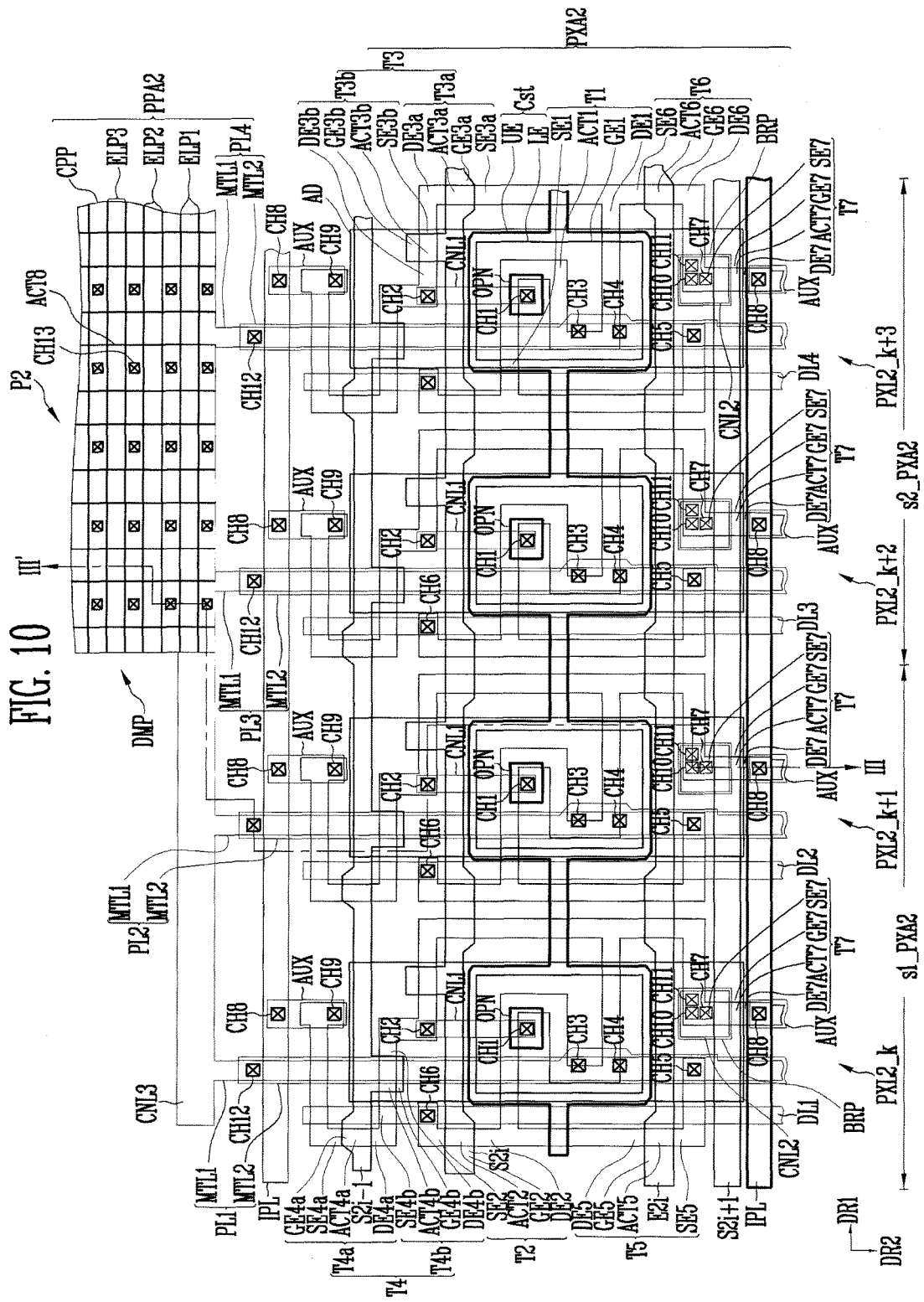
FIG. 10 is a plan view conceptually illustrating a portion corresponding to the area P2 of FIG. 8A.
Figure 11:
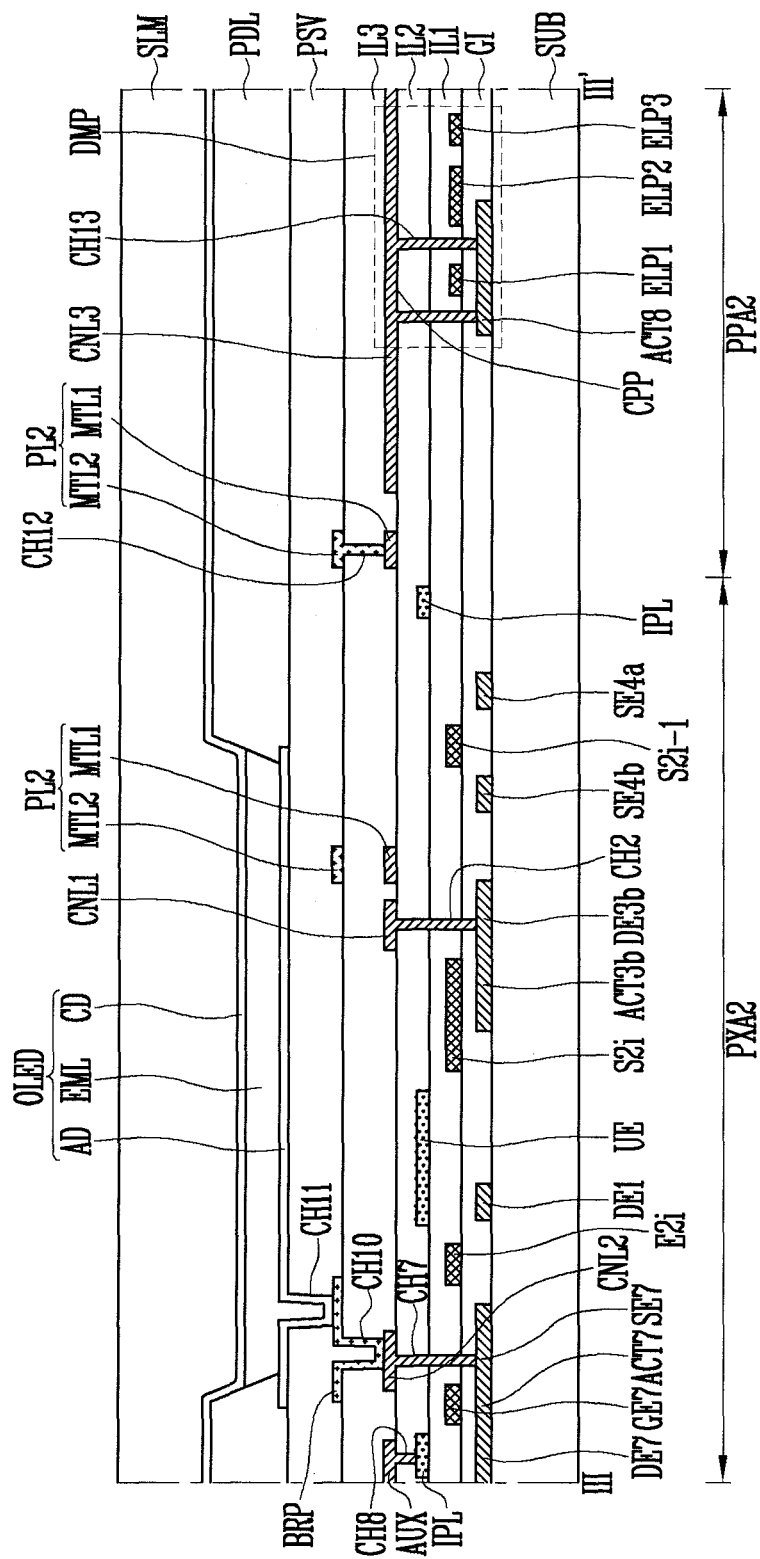
FIG. 11 is a sectional view taken along the line III-III' of FIG. 10.

FIG. 10 is a plan view conceptually illustrating a portion corresponding to the area P2 of FIG. 8A. FIG. 11 is a sectional view taken along the line III-III' of FIG. 10.

For convenience of description, based on a kth second pixel PXL2_$k$ located on an ith row and a kth column, a (k+1)th second pixel PXL2_$k$+1 located on the ith row and a (k+1)th column, a (k+2)th second pixel PXL2_$k$+2 located on the ith row and a (k+2)th column, and a (k+3)th second pixel PXL2_$k$+3 located on the ith row and a (k+3)th column, which are provided in the second pixel region PXA2, three second scan lines S2$i$−1, S2$i$, and S2$i$+1, a second emission control line E2$i$, and four data lines DL1, DL2, DL3, and DL4, which are respectively connected to the four second pixels PXL2_$k$ and PXL2_$k$+1, PXL2_$k$+2, and PXL2_$k$+3, are illustrated in FIGS. 10 and 11. Also, for convenience of description, the four second pixels PXL2_$k$ and PXL2_$k$+1, PXL2_$k$+2, and PXL2_$k$+3 and a dummy part DMP located on the same column in a direction vertical to portions of the four second pixels PXL2_$k$ and PXL2_$k$+1, PXL2_$k$+2, and PXL2_$k$+3 are mainly illustrated in FIGS. 8A and 10.

In FIGS. 10 and 11, for convenience of description, a second scan line on an (i−1)th row is referred to as an "(i−1)th second scan line S2$i$−1," a second scan line on the ith row is referred to as an "ith second scan line S2$i$," a second scan line on an (i+1)th row is referred to as an "(i+1)th second scan line S2$i$+1," a second emission control line on the ith row is referred to as an "emission control line E2$i$," a data line on the kth column is referred to as a "first data line DL1," a data line on the (k+1)th column is referred to as a "second data line DL2," a data line on the (k+2)th column is referred to as a "third data line DL3," and a data line on the (k+3)th column is referred to as a "fourth data line DL4," a power line on the kth column is referred to as a "first power line PL1," a power line on the (k+1)th column is referred to as a "second power line PL2," a power line on the (k+2)th column is referred to as a "third power line PL3," and a power line on the (k+3)th column is referred to as a "fourth power line PL4."

Referring to FIGS. 1, 8A, 10, and 11, in the display device according to the embodiment of the present disclosure, structures having different parasitic capacitances for the respective pixel regions PXA may be applied using a dummy region DMP so as to compensate for a difference in load values between the respective pixel regions PXA. To compensate for a difference in load values between scan lines in the first to third pixel regions PXA1, PXA2, and PXA3, the dummy part DMP is not provided in a first peripheral region PPA1 corresponding to the first pixel region PXA1, and may be provided in a second peripheral region PPA2 corresponding to the second pixel region PXA2, and may be provided in a third peripheral region PPA3 corresponding to the third pixel region PXA3. The dummy part DMP may also be provided in the additional peripheral region APA.

The display device according to the embodiment of the present disclosure may include a substrate SUB, a line unit, and second pixels PXL2_$k$, PXL2_$k$+1, PXL2_$k$+2, and PXL2_$k$+3.

The line unit may include second scan lines S2$i$−1, S2$i$, and S2$i$+1, data lines DL1, DL2, DL3, and DL4, an emission control line E2$i$, power lines PL1, PL2, PL3, and PL4, and an initialization power line IPL.

The second scan lines S2$i$−1, S2$i$, and S2$i$+1 may be provided in the second pixel region PXA2, and may respectively provide a scan signal to the second pixels PXL2_$k$, PXL2_$k$+1, PXL2_$k$+2, and PXL2_$k$+3. In this case, a length of the second scan lines S2$i$−1, S2$i$, and S2$i$+1 may be different from that of first scan lines (see S11 to S1$n$ of FIG. 3) provided in the first pixel region PXA1. Specifically, the length of the second scan lines S2$i$−1, S2$i$, and S2$i$+1 may be shorter than that of the first scan lines S11 to S1$n$.

The second scan lines S2$i$−1, S2$i$, and S2$i$+1 may extend in a first direction DR1 on the substrate SUB. The second scan lines S2$i$−1, S2$i$, and S2$i$+1 may include an (i−1)th second scan line S2$i$−1, an ith second scan line S2$i$, and an (i+1)th second scan line S2$i$+1, which are sequentially arranged along a second direction DR2 intersecting the first direction DR1. The scan signal may be applied to each of the second scan lines S2$i$−1, S2$i$, and S2$i$+1.

The emission control line E2$i$ may extend in the first direction DR1. When viewed on a plane, the emission control line E2$i$ may be located between the ith second scan line S2$i$ and the (i+1)th second scan line S2$i$+1. An emission control signal may be applied to the emission control line E2$i$.

The data lines DL1, DL2, DL3, and DL4 may extend in the second direction DR2 intersecting the first direction DR1 on the substrate SUB. The data lines DL1, DL2, DL3, and DL4 may include first to fourth data lines DL1 to DL4 sequentially arranged along the first direction DR1. A data signal may be applied to the first to fourth data lines DL1 to DL4.

The power lines PL1, PL2, PL3, and PL4 may extend along the second direction DR2, and be located to be spaced apart from the data lines DL1, DL2, DL3, and DL4. The power lines PL1, PL2, PL3, and PL4 may include first to fourth power lines PL1 to PL4 sequentially arranged along the first direction DR1. A first power source (see ELVDD of FIG. 3) may be applied to the first to fourth power lines PL1 to PL4.

Each of the power lines PL1, PL2, PL3, and PL4 may be provided in a double layer including a first metal layer MTL1 and a second metal layer MTL2. The second metal layer MTL2 may cover the first metal layer MTL1 and overlap with the first metal layer MTL1 when viewed on a plane.

The initialization power line IPL may extend along the first direction DR1, and an initialization power source (see Vint of FIG. 3) may be applied to the initialization power line IPL.

The second pixels PXL2_$k$, PXL2_$k$+1, PXL2_$k$+2, and PXL2_$k$+3 may include a kth second pixel PXL2_$k$ to which the second scan lines S2$i$−1, S2$i$, and S2$i$+1 and the first data line DL1 are connected, a (k+1)th second pixel PXL2_$k$+1 to which the second scan lines S2$i$−1, S2$i$, and S2$i$+1 and the second data line DL2 are connected, a (k+2)th second pixel PXL2_$k$+2 to which the second scan lines S2$i$−1, S2$i$, and S2$i$+1 and the third data line DL3 are connected, and a (k+3)th second pixel PXL2_$k$+3 to which the second scan lines S2$i$−1, S2$i$, and S2$i$+1 and the fourth data line DL4 are connected.

Each of the kth second pixel PXL_$k$, the (k+1)th second pixel PXL2_$k$+1, the (k+2)th second pixel PXL2_$k$+2, and the (k+3)th second pixel PXL2_$k$+3 may include an organic light emitting device OLED, first to seventh transistors T1 to T7, and a storage capacitor Cst.

The first transistor T1 may include a first active pattern ACT1, a gate electrode GE1 provided on the first active pattern ACT1, and first source and drain electrodes SE1 and DE1 each connected to the first active pattern ACT1. Also, the first transistor T1 may include a first connection line CNL.

The second transistor T2 may include a second gate electrode GE2, a second active pattern ACT2, a second source electrode SE2, and a second drain electrode DE2.

The third transistor T3 may include a third gate electrode GE3, a third active pattern ACT3, a third source electrode SE3, and a third drain electrode DE3. The third transistor T3 may be provided in a double gate structure so as to prevent a leakage current.

The fourth transistor T4 may include a fourth gate electrode GE4, a fourth active pattern ACT4, a fourth source electrode SE4, and a fourth drain electrode DE4. The fourth transistor T4 may be provided in a double gate structure so as to prevent a leakage current.

The fifth transistor T5 may include a fifth gate electrode GE5, a fifth active pattern ACT5, a fifth source electrode SE5, and a fifth drain electrode DE5.

The sixth transistor T6 may include a sixth gate electrode GE6, a sixth active pattern ACT6, a sixth source electrode SE6, and a sixth drain electrode DE6.

The seventh transistor T7 may include a seventh gate electrode GE7, a seventh active pattern ACT7, a seventh source electrode SE7, and a seventh drain electrode DE7.

The organic light emitting device OLED may include a first electrode AD, a second electrode CD located on the first electrode AD, and an emitting layer EML located between the two electrodes AD and CD.

The storage capacitor Cst may include a lower electrode LE and an upper electrode UE provided on the lower electrode LE.

The substrate SUB may include the second pixel region PXA2 in which the second pixels PXL2_$k$, PXL2_$k$+1, PXL2_$k$+2, and PXL2_$k$+3 are provided, and the second peripheral region PPA2 surrounding the second pixel region PXA2.

The dummy part DMP for compensating for a difference in load values between the pixel regions PXA may be provided in the second peripheral region PPA2.

The second pixel region PXA2 may include a first sub-region s1_PXA2 and a second sub-region s2_PXA2. The second sub-region s2_PXA2 may be a region corresponding to the dummy part DMP located in the second peripheral region PPA2, and the first sub-region s1_PXA2 may be a region not corresponding to the dummy part DMP.

The kth second pixel PXL2_$k$ and the (k+1)th second pixel PXL2_$k$+1 may be located in the first sub-region s1_PXA2, and the (k+2)th second pixel PXL2_$k$+2 and the (k+3)th second pixel PXL2_$k$+3 may be located in the second sub-region s2_PXA2. Here, the kth second pixel PXL2_$k$ and the (k+1)th second pixel PXL2_$k$+1 may be pixels located adjacent to a first longitudinal side S3 of the second pixel region PXA2 partially including an oblique line S3$a$.

The dummy part DMP may correspond to the second sub-region s2_PXA2 and include an eighth active pattern ACT8, extension lines ELP1, ELP2, and ELP3, and a conductive pattern CPP.

The eighth active pattern ACT8 may be provided in the same layer as the first to seventh active patterns ACT1 to ACT7 provided in the second pixels PXL2_$k$, PXL2_$k$+1, PXL2_$k$+2, and PXL2_$k$+3. The eighth active pattern ACT8 may be formed of a semiconductor layer undoped or doped with impurities. The eighth active pattern ACT8 may have a bar shape extending in the second direction DR2, and may be located in the first direction DR1. However, the present disclosure is not limited thereto. When viewed on a plane, the eighth active pattern ACT8 may partially overlap with the extension lines ELP1, ELP2, and ELP3.

The extension lines ELP1, ELP2, and ELP3 (hereinafter, referred to as "ELP") may be lines formed as the second scan lines S2$i$−1, S2$i$, and S2$i$+1 and the emission control line E2$i$, which are located in the second pixel region PXA2, and may extend to the second peripheral region PPA2.

The conductive pattern CPP may be located on the eighth active pattern ACT8 and the extension lines ELP, and may overlap with the eighth active pattern ACT8 and the extension lines ELP when viewed on a plane. The conductive pattern CPP may be connected to the eighth active pattern ACT8 through a thirteenth contact hole CH13. Also, the conductive pattern CPP may be electrically connected to the third power line PL3 connected to the (k+2)th second pixel PXL2_$k$+2 and the fourth power line PL4 connected to the (k+3)th second pixel PXL2_$k$+3.

The conductive pattern CPP may be integrally provided with the first metal layer MTL1 of the third power line PL3 and the first metal layer MTL1 of the fourth power line PL4. Therefore, the first power source ELVDD applied to the third and fourth power lines PL3 and PL4 may also be applied to the conductive pattern CPP.

Here, because the conductive pattern CPP is connected to the eighth active pattern ACT8 through the thirteenth contact hole CH13, the first power source ELVDD may also be applied to the eighth active pattern ACT8. Therefore, in the dummy part DMP, the eighth active pattern ACT8 may overlap with the extension lines ELP with a gate insulating layer GI interposed therebetween to form a parasitic capacitor, and the extension lines ELP may overlap with the conductive pattern CPP with first and second insulating layers IL1 and IL2 interposed therebetween to form a parasitic capacitor. A parasitic capacitance of the parasitic capacitor of the dummy part DMP may increase a load value of the second scan lines S2$i$−1, S2$i$, and S2$i$+1 and/or the emission control line E2$i$, provided in the second pixel region PXA2. Consequently, the load value of the second scan lines S2$i$−1, S2$i$, and S2$i$+1 may be equal or similar to that of the first scan lines of the first pixel region PXA1.

Meanwhile, a third connection line CNL3 connected to the dummy part DMP may be provided in the second peripheral region PPA2. The third connection line CNL3 may be provided in only a portion of the second peripheral region PPA2, which corresponds to the first sub-region s1_PXA2.

The third connection line CNL3 may be electrically connected to the first power line PL1 connected to the kth second pixel PXL2_$k$ and the second power line PL2 connected to the (k+1)th second pixel PXL2_$k$+1. The third connection line CNL3 may be integrally provided with the first metal layer MTL1 of the first power line PL1 and the first metal layer MTL1 of the second power line PL2. Also, the third connection line CNL3 may be integrally provided with the conductive pattern CPP.

Therefore, the first power source ELVDD applied to the conductive pattern CPP may also be applied to the third connection line CNL3.

The third connection line CNL3, the conductive pattern CPP, and the first to fourth power lines PL1, PL2, PL3, and PL4 may be electrically connected to one another to be arranged in a mesh form when viewed on a plane. Thus, if the first power source ELVDD is applied to the first to fourth power lines PL1, PL2, PL3, and PL4, the first power source ELVDD can be uniformly provided to the second pixel region PXA2. Accordingly, the second pixel region PXA2 can implement uniform luminance throughout the entire region.

If a contact failure occurs in the first and second lines PL1 and PL2, because the first and second power lines PL1 and PL2 are not connected to the third connection line CNL3, the first power source ELVDD may not be properly applied to the first and second lines PL1 and PL2. In this case, a difference in luminance may occur between the second sub-region s2_PXA2, which is connected to the dummy part DMP, and the first sub-region s1_PXA2 that is not connected to the dummy part DMP. Such a difference in luminance may cause an image quality defect in the display device.

Accordingly, in the embodiment of the present disclosure, as the third connection line CNL3 is located in the second peripheral region PPA2, the first and second power lines PL1 and PL2 not connected to the dummy part DMP are connected to the third connection line CNL3, thereby preventing the image quality defect.

In an embodiment of the present disclosure, the parasitic capacitance formed by the dummy part DMP may be differently set based on a load value of scan lines and/or emission control lines, which are to be compensated.

In an embodiment of the present disclosure, a case where a single dummy part DMP is provided is illustrated for convenience of description, but the present disclosure is not limited thereto. For example, the dummy part DMP may be provided as a plurality within a range that the area of the second peripheral region PPA2 is not enlarged.

In an embodiment of the present disclosure, the connection relationship between the dummy part DMP and the third connection line CNL3 may be identically applied to a third peripheral region PPA3, and therefore, a detailed description of the third peripheral region PPA3 will be omitted.

Hereinafter, a structure of the display device according to the embodiment of the present disclosure will be described along a stacking order with reference to FIGS. 10 and 11.

First, the active patterns ACT1 to ACT8 (hereinafter, referred to as "ACT") may be provided on the substrate SUB. The active pattern ACT may be formed of a semiconductor material.

The gate insulating layer GI may be provided on the substrate SUB on which the active patterns ACT are provided.

The first gate electrode GE1 may be the lower electrode LE of the storage capacitor Cst. The second and third gate electrode GE2 and GE3 may be integrally formed with the ith second scan line S2$i$, and the fifth and sixth gate electrodes GE5 and GE6 may be integrally formed with the emission control line E2$i$. The fourth gate electrode GE4 may be integrally formed with the (i−1)th second scan line S2$i$−1, and the seventh gate electrode GE7 may be integrally formed with the (i+1)th second scan line S2$i$+1.

The first insulating layer IL1 may be provided on the substrate SUB on the second scan lines S2$i$−1, S2$i$, and S2$i$+1 and the like.

The upper electrode UE of the storage capacitor Cst and the initialization power line IPL may be provided on the first insulating layer IL1. The upper electrode UE may cover the lower electrode LE. The upper electrode UE along with the lower electrode LE may constitute the storage capacitor Cst with the first insulating layer IL1 interposed therebetween.

The second insulating layer IL2 may be provided on the substrate SUB on the upper electrode UE and the like.

The first to fourth data lines DL1, DL2, DL3, and DL4, the first metal layer MTL1, an auxiliary connection line AUX, the first to third connection lines CNL1, CNL2, and CNL3, and the conductive pattern CPP may be provided on the second insulating layer IL2.

The first to fourth data lines DL1, DL2, DL3, and DL4 may be connected to the second source electrode SE2 of a corresponding second pixel PXL2_$k$, PXL2_$k$+1, PXL2_$k$+2, or PXL2_$k$+3 through a sixth contact hole CH6 sequentially passing through the gate insulating layer GI and the first and second insulating layers IL1 and IL2.

The first metal layer MTL1 may be connected to the fifth source electrode SE5 of a corresponding second pixel PXL2_$k$, PXL2_$k$+1, PXL2_$k$+2, or PXL2_$k$+3 through a fifth contact hole CH5 sequentially passing through the gate insulating layer GI and the first and second insulating layers IL1 and IL2. Also, the first metal layer MTL1 may be connected to the upper electrode UE of a corresponding second pixel PXL2_$k$, PXL2_$k$+1, PXL2_$k$+2, or PXL2_$k$+3 through third and fourth contact holes CH3 and CH4 passing through the second insulating layer IL2.

The auxiliary connection line AUX may be connected to the initialization power line IPL through an eighth contact hole CH8 passing through the second insulating layer IL2. Also, the auxiliary connection line AUX may be connected to the seventh drain electrode DE7 of a corresponding second pixel PXL2_$k$, PXL2_$k$+1, PXL2_$k$+2, or PXL2_$k$−3 through a ninth contact hole CH9 sequentially passing through the gate insulating layer GI and the first and second insulating layers IL1 and IL2.

The first connection line CNL1 may be connected to the first gate electrode GE1 of a corresponding second pixel PXL2_$k$, PXL2_$k$+1, PXL2_$k$+2, or PXL2_$k$+3 through a first contact hole CH1 sequentially passing through the first and second insulating layers IL1 and IL2. Also, the first connection line CNL1 may be connected to each of the third and fourth drain electrodes DE3 and DE4 of a corresponding second pixel PXL2_$k$, PXL2_$k$+1, PXL2_$k$+2, or PXL2_$k$+3 through a second contact hole CH2 sequentially passing through the gate insulating layer GI and the first and second insulating layers IL1 and IL2.

The second connection line CNL2 may be connected to each of the sixth drain electrode DE6 and the seventh source electrode SE7 of a corresponding second pixel PXL2_$k$, PXL2_$k$+1, PXL2_$k$+2, or PXL2_$k$+3 through a seventh contact hole CH7 sequentially passing through the gate insulating layer GI and the first and second insulating layers IL1 and IL2.

The third connection line CNL3 may be integrally provided with the first metal layer MTL1 located in the first sub-region s1_PXA2 to be connected to the first metal layer MTL1.

The conductive pattern CPP may be connected to the eighth active pattern ACT8 through the thirteenth contact hole CH13 sequentially passing through the gate insulating layer GI and the first and second insulating layers IL1 and IL2. Also, the conductive pattern CPP may be integrally provided with the first metal layer MTL1 located in the second sub-region s2_PXA2 to be connected to the first metal layer MTL1.

The third connection line CNL3 may be integrally provided with the conductive pattern CPP to be connected to the conductive pattern CPP.

The third insulating layer IL3 may be provided on the substrate SUB on the data lines DL1, DL2, DL3, and DL4 and the like.

A bridge pattern BRP and the second metal layer MTL2 may be provided on the third insulating layer IL3.

The bridge pattern BRP may be connected to the second connection line CNL2 through a tenth contact hole CH10 passing through the third insulating layer IL3.

The second metal layer MTL2 may be connected to the first metal layer MTL1 through the twelfth contact hole CH12.

The protective layer PSV may be provided on the substrate SUB on the bridge pattern BRP and the like.

The first electrode AD may be provided on the protective layer PSV.

The first electrode AD may be connected to the bridge pattern BRP through an eleventh contact hole CH11 passing through the protective layer PSV. The first electrode AD may be connected to each of the sixth drain electrode DE6 and the seventh source electrode SE7 of a corresponding second pixel PXL2_$k$, PXL2_$k$+1, PXL2_$k$+2, or PXL2_$k$+3 through the bridge pattern BRP and the second contact line CNL2.

A pixel defining layer PDL defining a light emitting region of each of the second pixels PXL2_$k$, PXL2_$k$+1, PXL2_$k$+2, and PXL2_$k$+3 may be provided on the substrate SUB on which the first electrode AD and the like are provided. The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be provided in the light emitting region of each of the second pixels PXL2_$k$, PXL2_$k$+1, PXL2_$k$+2, and PXL2_$k$+3 and surrounded by the pixel defining layer PDL, and the second electrode CD may be provided on the emitting layer EML.

The emitting layer EML may be located on the exposed surface of the first electrode AD. The emitting layer EML may have a multi-layered thin film structure including at least a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) for smoothly transporting electrons to the LGL, and an electron transport layer (EIL) for injecting electrons.

The color of light generated in the LGL may be one of red, green, blue, and white, but this embodiment is not limited thereto. For example, the color of light generated in the LGL of the emitting layer EML may also be one of magenta, cyan, and yellow.

The HIL, the HTL, the HBL, the ETL, and the EIL may be common layers connected in adjacent light emitting regions.

An encapsulation layer SLM covering the second electrode CD may be provided over the second electrode CD. The encapsulation layer SLM may reduce or prevent oxygen and moisture from penetrating into the organic light emitting device OLED. The encapsulation layer SLM may include an inorganic layer. The inorganic layer may include at least one selected from the group consisting of silicon oxide, silicon nitride, silicon oxynitride, aluminum oxide, titanium oxide, zirconium oxide, and tin oxide.

FIGS. 12 to 17 are layout views schematically illustrating the second pixels, the dummy part, and the first electrode, which are shown in FIG. 10, for each layer.

Figure 12:
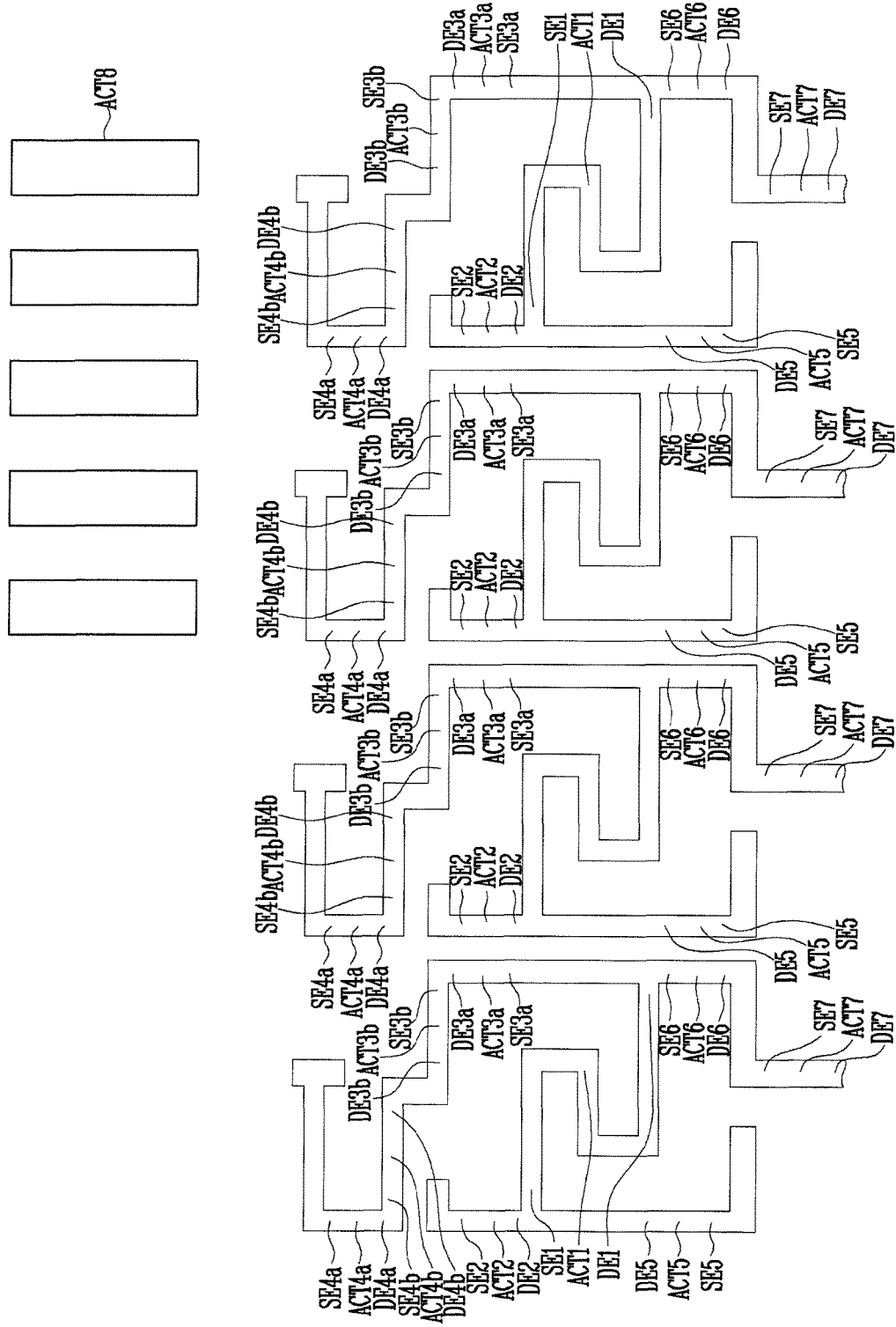
FIGS. 12 to 17 are layout views schematically illustrating second pixels, a dummy part, and a first electrode, which are shown in FIG. 10, for each layer.
Figure 13:
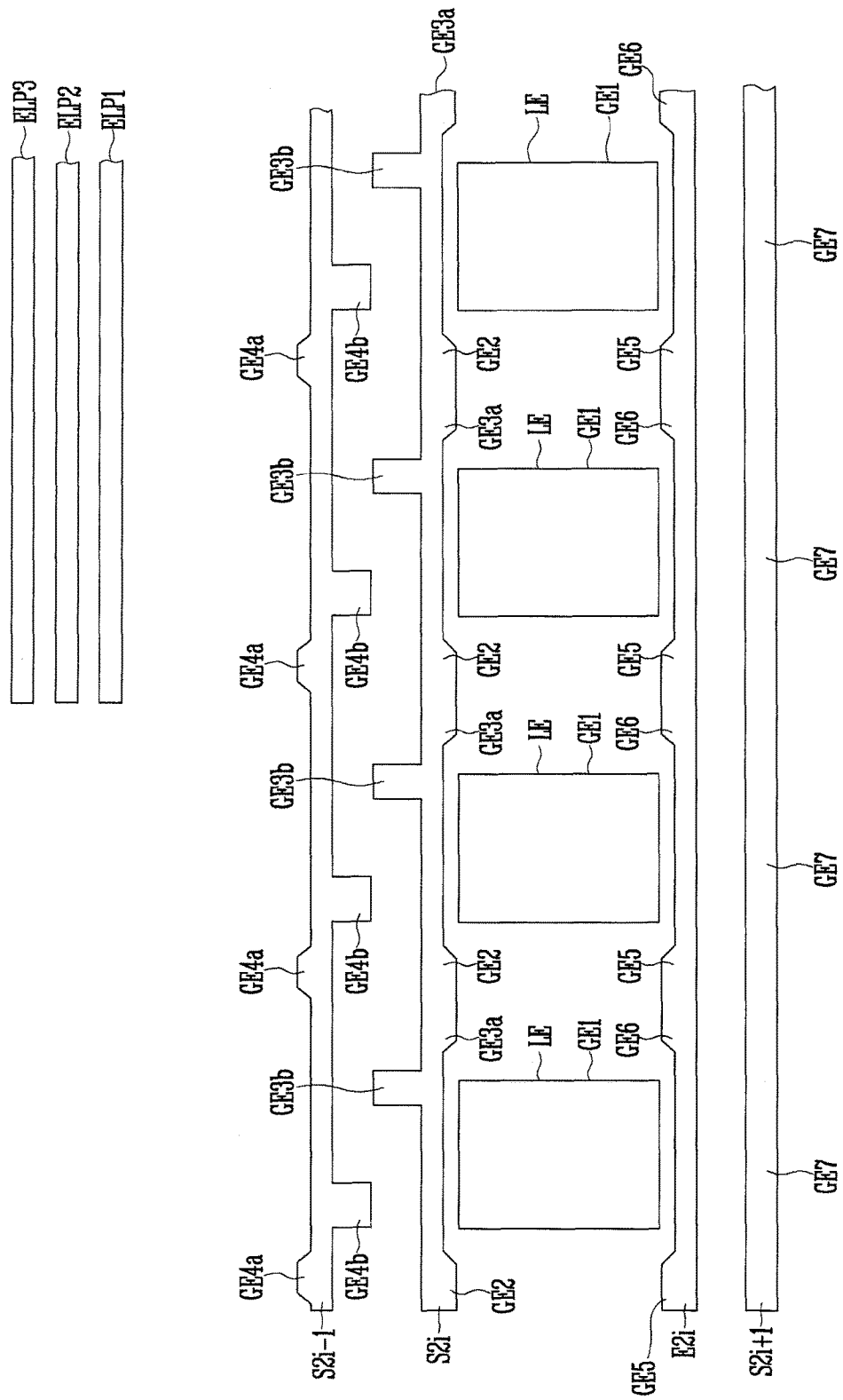

First, referring to FIGS. 10 and 12, first to eighth active patterns ACT1 to ACT8 may be provided on a substrate (see SUB of FIG. 11). The first to eighth active patterns ACT1 to ACT8 may be provided in the same layer, and may be formed through the same process.

One end of the first active pattern ACT1 may be connected to a first source electrode SE1, and the other end of the first active pattern ACT1 may be connected to the first drain electrode DE1. One end of the second active pattern ACT2 may be connected to a second source electrode SE2, and the other end of the second active pattern ACT2 may be connected to a second drain electrode DE2. One end of the third active pattern ACT3 may be connected to a third source electrode SE3, and the other end of the third active pattern ACT3 may be connected to a third drain electrode DE3. One end of the fourth active pattern ACT4 may be connected to a fourth source electrode SE4, and the other end of the fourth active pattern ACT4 may be connected to a fourth drain electrode DE4. One end of the fifth active pattern ACT5 may be connected to a fifth source electrode SE5, and the other end of the fifth active pattern ACT5 may be connected to a fifth drain electrode DE5. One end of the sixth active pattern ACT6 may be connected to a sixth source electrode SE6, and the other end of the sixth active pattern ACT6 may be connected to a sixth drain electrode DE6. One end of the seventh active pattern ACT7 may be connected to a seventh source electrode SE7, and the other end of the seventh active pattern ACT7 may be connected to a seventh drain electrode DE7.

Referring to FIGS. 10 to 13, second scan lines S2$i$−1, S2$i$, and S2$i$+1, an emission control line E2$i$, a lower electrode LE, and first to third extension lines ELP1, ELP2, and ELP3 may be respectively provided on the first to eighth active patterns ACT1 to ACT8 with a gate insulating layer (see GI of FIG. 11) interposed therebetween. The second scan lines S2$i$−1, S2$i$, and S2$i$+1, the emission control line E2$i$, the lower electrode LE, and the first to third extension lines ELP1, ELP2, and ELP3 may be provided in the same layer, and may be formed through the same process.

Here, the second scan lines S2$i$−1, S2$i$, and S2$i$+1 may include an (i−1)th second scan line S2$i$−1, an ith second scan line S2$i$, and an (i+1)th second scan line S2$i$+1. A fourth gate electrode GE4 may be provided to the (i−1)th second scan line S2$i$−1, second and third gate electrodes GE2 and GE3 may be provided to the ith second scan line S2$i$, and a seventh gate electrode GE7 may be provided to the (i+1)th second scan line S2$i$+1.

A first gate electrode GE1 may be provided to the lower electrode LE. Fifth and sixth gate electrodes GE5 and GE6 may be provided to the emission control line E2$i$.

The first to third extension lines ELP1, ELP2, and ELP3 may be lines respectively extending from at least three lines among the second scan lines S2$i$−1, S2$i$, and S2$i$+1 and the emission control line E2$i$.

Figure 14:
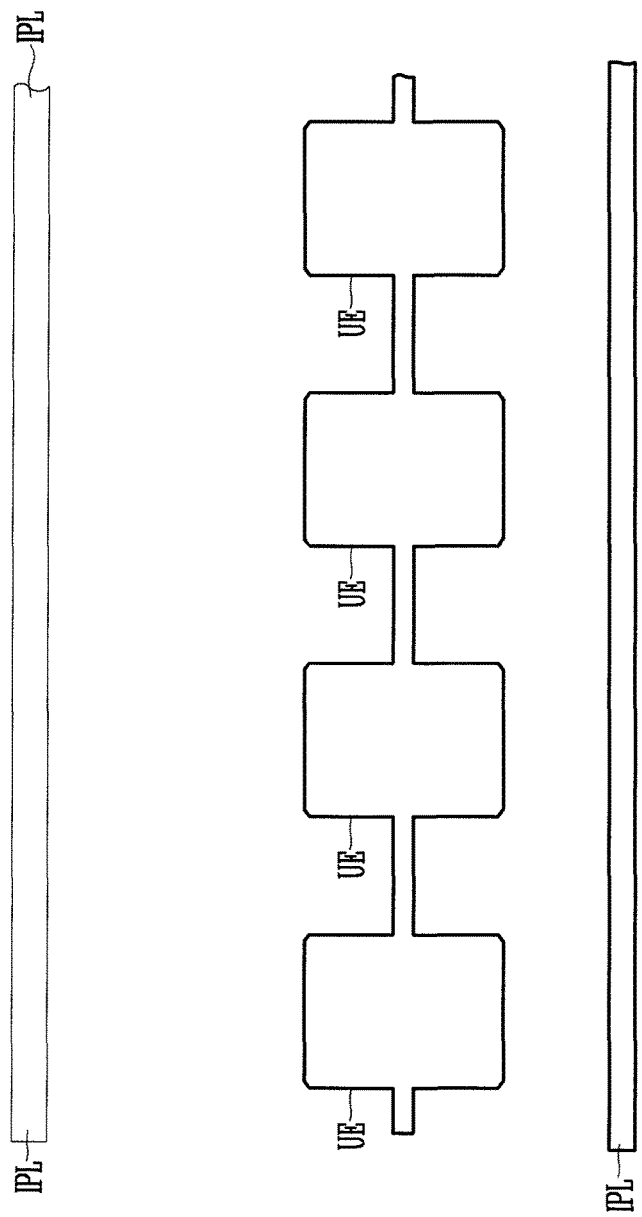

Referring to FIGS. 10 and 14, an initialization power line IPL and an upper electrode UE may be provided on the second scan lines S2$i$−1, S2$i$, and S2$i$+1, the emission control line E2$i$, the lower electrode LE, and the first to third extension lines ELP1, ELP2, and ELP3 with a first insulating layer (see IL1 of FIG. 11) interposed therebetween. The initialization power line IPL and the upper electrode UE may be provided in the same layer, and may be formed through the same process.

Figure 15:
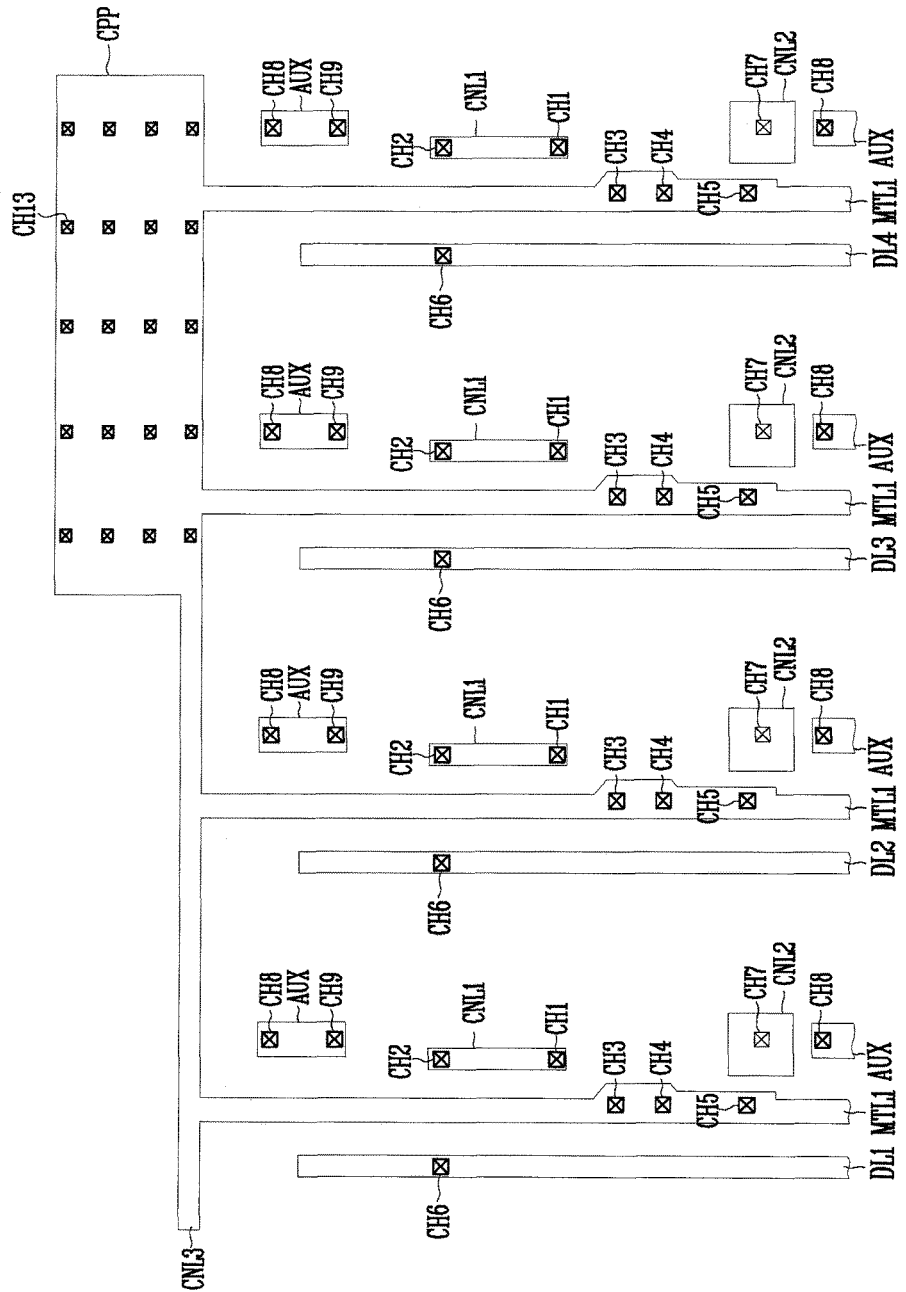

Referring to FIGS. 10 and 15, first to fourth data lines DL1, DL2, DL3, and DL4, a first metal layer MTL1, an auxiliary connection line AUX, first to third connection lines CNL1, CNL2, and CNL3, and a conductive pattern CPP may be provided on the initialization power line IPL and the upper electrode UE with a second insulating layer (see IL2 of FIG. 11) interposed therebetween.

Each of the first to fourth data lines DL1, DL2, DL3, and DL4 may be connected to a respective second source electrode SE2 of a corresponding second pixel PXL2_k, PXL2_k+1, PXL2_k+2, or PXL2_k+3 through a sixth contact hole CH6.

The first metal layer MTL1 may be connected to the upper electrode UE of a corresponding second pixel PXL2_k, PXL2_k+1, PXL2_k+2, or PXL2_k+3 through third and fourth contact holes CH3 and CH4. Also, the first metal layer MTL1 may be connected to the fifth source electrode SE5 of a corresponding second pixel PXL2_k, PXL2_k+1, PXL2_k+2, or PXL2_k+3 through a fifth contact hole CH5.

The auxiliary connection line AUX may be connected to the initialization power line IPL. Also, the auxiliary connection line AUX may be connected to the seventh drain electrode DE7 of a corresponding second pixel PXL2_k, PXL2_k+1, PXL2_k+2, or PXL2_k+3 through a ninth contact hole CH9.

The first connection line CNL1 may be connected to the first gate electrode GE1 of a corresponding second pixel PXL2_k, PXL2_k+1, PXL2_k+2, or PXL2_k+3 through a first contact hole CH1. Also, the first connection line CNL1 may be connected to each of the third and fourth drain electrodes DE3 and DE4 of a corresponding second pixel PXL2_k, PXL2_k+1, PXL2_k+2, or PXL2_k+3 through a second contact hole CH2.

The second connection line CNL2 may be connected to each of the sixth drain electrode DE6 and the seventh source electrode SE7 of a corresponding second pixel PXL2_k, PXL2_k+1, PXL2_k+2, or PXL2_k+3 through a seventh contact hole CH7.

The third connection line CNL3 may be integrally provided with the first metal layer MTL1 located in a first sub-region s1_PXA2 to be connected to the first metal layer MTL1 of the first sub-region s1_PXA2.

The conductive pattern CCP may be connected to the eighth active pattern ACT8 through a thirteenth contact hole CH13. Also the contact pattern CPP may be integrally provided with the first metal layer MTL1 located in the first sub-region s1_PXA2 to be connected to the first metal layer MTL1 of the first sub-region s1_PXA2.

Figure 16:
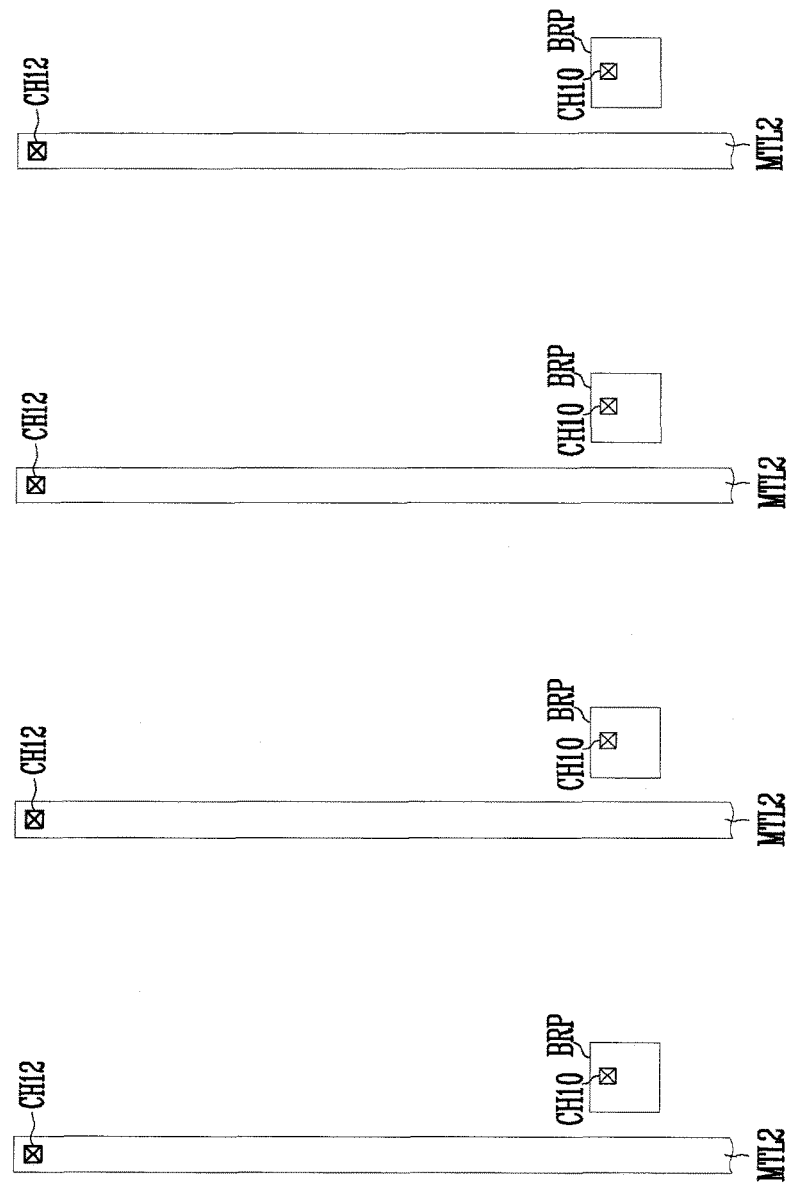

Referring to FIGS. 10 and 16, a bridge pattern BRP and a second metal layer MTL2 may be provided on the first to fourth data lines DL1, DL2, DL3, and DL4, the first metal layer MTL1, the auxiliary connection line AUX, the first to third connection lines CNL1, CNL2, and CNL3, and the conductive pattern CPP with a third insulating layer (see IL3 of FIG. 11) interposed therebetween.

The bridge pattern BRP may be connected to the second connection line CNL2 of a corresponding second pixel PXL2_k, PXL2_k+1, PXL2_k+2, or PXL2_k+3 through a tenth contact hole CH10.

The second metal layer MTL2 may be connected to the first metal layer MTL1 through a twelfth contact hole CH12.

Figure 17:
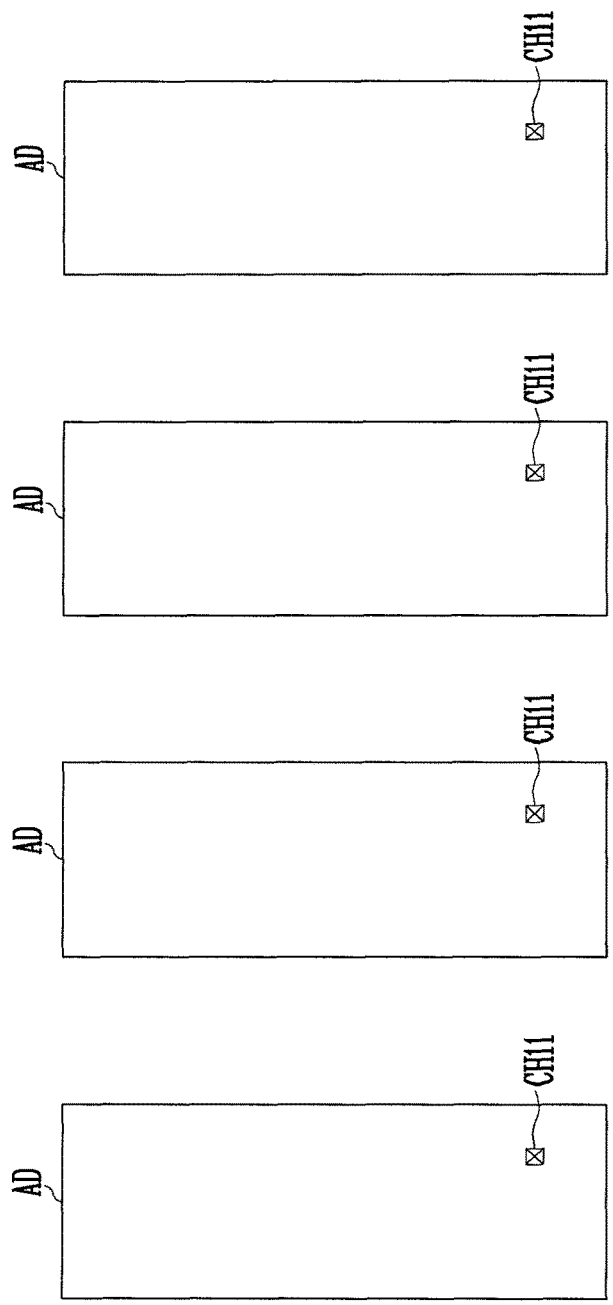

Referring to FIGS. 10 and 17, a first electrode AD may be provided on the bridge pattern BRP and the second metal layer MTL2 with a protective layer (see PSV of FIG. 11) interposed therebetween.

The first electrode AD may be connected to the bridge pattern BRP through an eleventh contact hole CH11.

Figure 18:
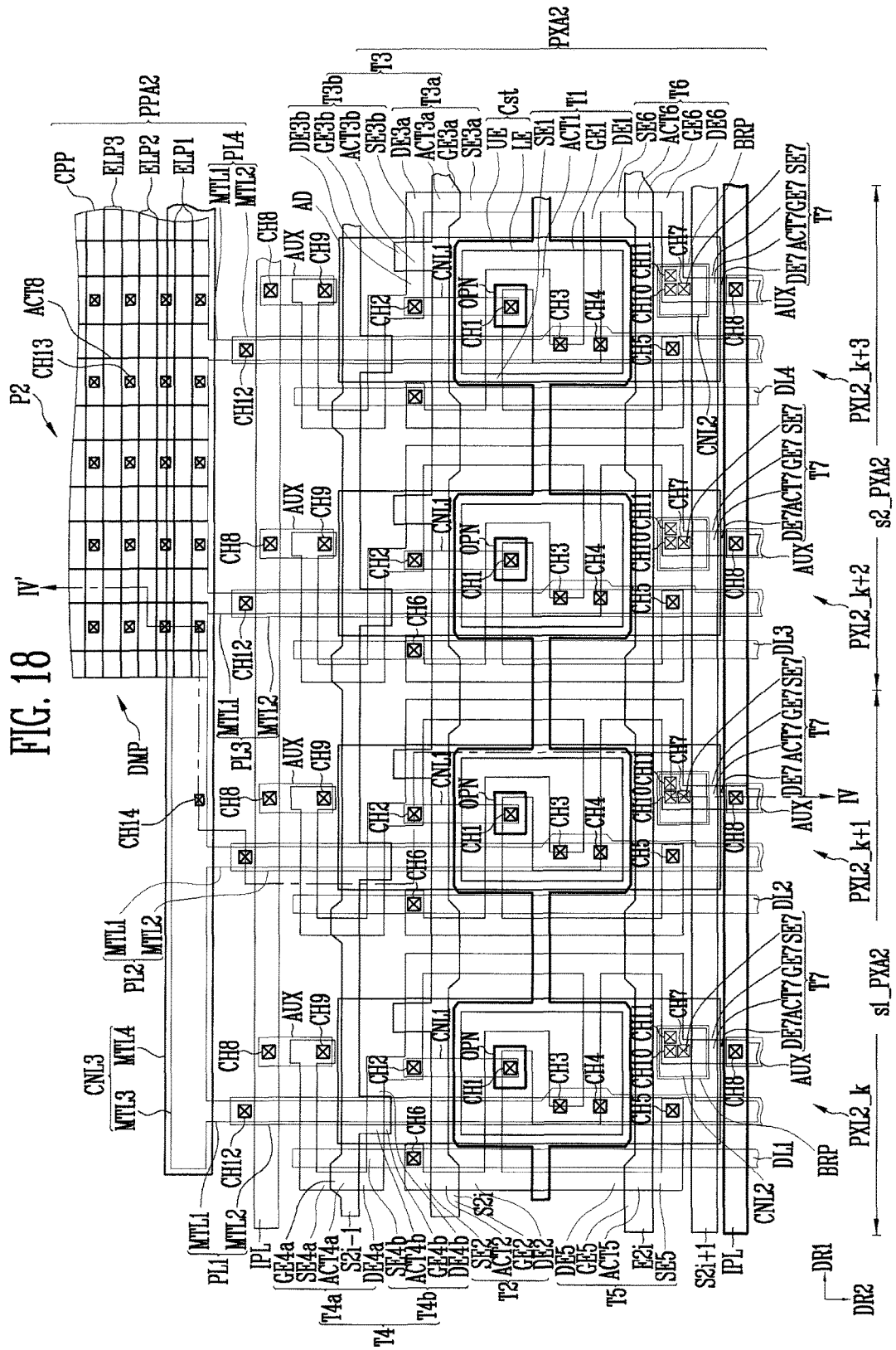
FIG. 18 illustrates a portion of a display device according to another embodiment of the present disclosure, which is a plan view corresponding to the area P2 of FIG. 8A.
Figure 19:
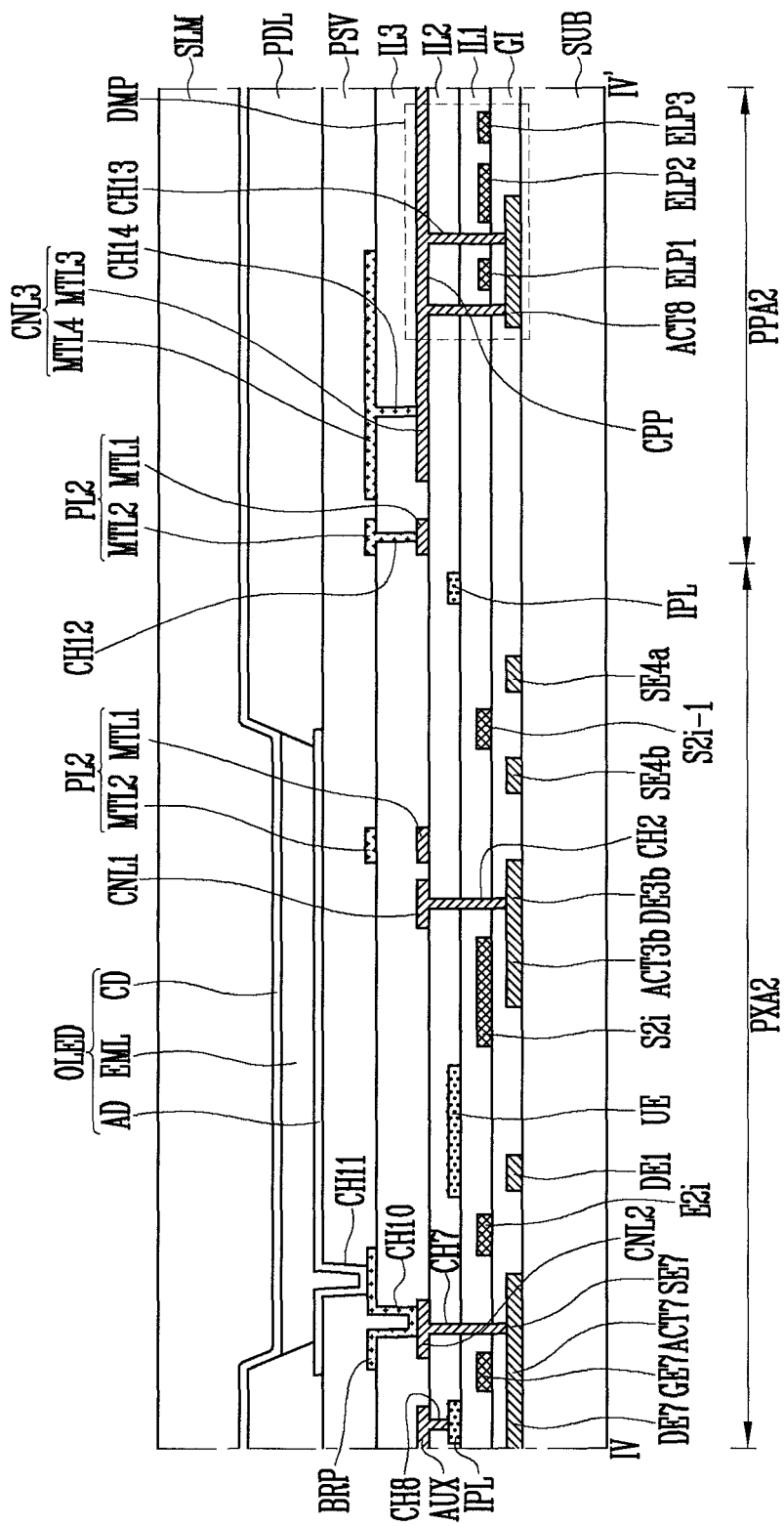
FIG. 19 is a sectional view taken along the line IV-IV' of FIG. 18.

FIG. 18 illustrates a portion of a display device according to another embodiment of the present disclosure, which is a plan view corresponding to the area P2 of FIG. 8A. FIG. 19 is a sectional view taken along the line IV-IV' of FIG. 18. In FIGS. 18 and 19, differences from the above-described embodiment will be mainly described to avoid redundancy. Portions not particularly described in the other embodiment of the present disclosure follow the above-described embodiment. In addition, identical reference numerals refer to identical components, and similar reference numerals refer to similar components.

Referring to FIGS. 1, 8A, 18, and 19, the display device according to the present embodiment of the present disclosure may include a substrate SUB, a line unit, and second pixels PXL2_k, PXL2_k+1, PXL2_k+2, and PXL2_k+3.

The substrate SUB may include a second pixel region PXA2 in which the second pixels PXL2_k, PXL2_k+1, PXL2_k+2, and PXL2_k+3 are provided, and a second peripheral region PPA2 provided at the periphery of the second pixel region PXA2. A dummy part DMP may be located in the second peripheral region PPA2. Here, the second pixel region PXA2 may include a second sub-region s2_PXA2 corresponding to the dummy part DMP, and a first sub-region s1_PXA2 not corresponding to the dummy part DMP.

The line unit may include second scan lines S2i−1, S2i, and S2i+1, first to fourth data lines DL1, DL2, DL3, and DL4, an emission control line E2i, first to fourth power lines PL1, PL2, PL3, and PL4, and an initialization power line IPL, which provide signals to each of the second pixels PXL2_k, PXL2_k+1, PXL2_k+2, and PXL2_k+3.

Each of the first to fourth power lines PL1, PL2, PL3, and PL4 may be provided in a double layer including a first metal layer MTL1, and a second metal layer MTL2 located on the first metal layer MTL1. Here, the second metal layer MTL2 may be connected to the first metal layer MTL1 through a twelfth contact hole CH12 passing through a third insulating layer IL3.

The second pixels PXL2_k, PXL2_k+1, PXL2_k+2, and PXL2_k+3 may include a kth second pixel PXL2_k connected to the second scan lines S2i−1, S2i, and S2i+1 and the first data line DL1, a (k+1)th second pixel PXL2_k+1 connected to the second scan lines S2i−1, S2i, and S2i+1 and the second data line DL2, a (k+2)th second pixel PXL2_k+2 connected to the second scan lines S2i−1, S2i, and S2i+1 and the third data line DL3, and a (k+3)th second pixel PXL2_k+3 connected to the second scan lines S2i−1, S2i, and S2i+1 and the fourth data line DL4.

Each of the kth second pixel PXL2_k, the (k+1)th second pixel PXL2_k+1, the (k+2)th second pixel PXL2_k+2, and the (k+3)th second pixel PXL2_k+3 may include an organic light emitting device OLED, first to seventh transistors T1 to T7, and a storage capacitor Cst.

The dummy part DMP and a third connection line CNL3 may be provided in the second peripheral region PPA2.

The dummy part DMP is used to compensate for a difference in load values between respective pixel regions PXA, and may include an eighth active pattern ACT8, extension lines ELP1, ELP2, and ELP3, and a conductive pattern CPP.

The conductive pattern CPP may overlap with the eighth active pattern ACT8 and the extension lines ELP1, ELP2, and ELP3 when viewed on a plane. The conductive pattern CPP may be connected to the eighth active pattern ACT8 through a thirteenth contact hole CH13.

The conductive pattern CCP may be integrally provided with the first metal layer MTL1 of each of the third and fourth power lines PL3 and PL4 connected to the second sub-region s2_PXA2. Therefore, the conductive pattern CPP may be connected to the third and fourth power lines PL3 and PL4. Accordingly, a first power source (see ELVDD of FIG. 3) applied to the third and fourth power lines PL3 and PL4 may be applied to the conductive pattern CCP.

The third connection line CNL3 may be provided in a double layer including a third metal layer MTL3 and a fourth metal layer MTL4 provided on the third metal layer MTL3. Here, the third metal layer MTL3 may be located in only a portion of the second peripheral region PPA2, which corresponds to the first sub-region s1_PXA2, and the fourth metal layer MTL4 may be located in the entire second peripheral region PPA2. However, the present disclosure is not limited thereto. For example, the fourth metal layer MTL4 may be located in only a portion of the second peripheral region PPA2 to correspond to the third metal layer MTL3.

The third metal layer MTL3 may be electrically connected to the first power line PL1 connected to the kth second pixel PXL2_k, and may be electrically connected to the second power line PL2 connected to the (k+1)th second pixel PXL2_k+1. The third metal layer MTL3 may be integrally provided with the first metal layer MTL1 of the first power line PL1 and the first metal layer MTL1 of the second power line PL2. Also, the third metal layer MTL3 may be integrally provided with the conductive pattern CPP. Therefore, the first power source (see ELVDD of FIG. 3) applied to the conductive pattern CPP may also be applied to the third metal layer MTL3.

The fourth metal layer MTL4 may be connected to the third metal layer MTL3 through a fourteenth contact hole CH14 passing through the third insulating layer IL3. Therefore, the first power source ELVDD applied to the third metal layer MTL3 may also be applied to the fourth metal layer MTL4.

The third connection line CNL3, the conductive pattern CPP, and the first to fourth power lines PL1, PL2, PL3, and PL4 may be electrically connected to one another to be arranged in a mesh form when viewed on a plane. Thus, if the first power source ELVDD is applied to the first to fourth power lines PL1, PL2, PL3, and PL4, the first power source ELVDD can be substantially uniformly provided to the second pixel region PXA2. Accordingly, the second pixel region PXA2 can implement uniform luminance throughout the entire region.

Hereinafter, a structure of the display device according to the other embodiment of the present disclosure will be described along a stacking order with reference to FIGS. 18 and 19.

First, first to seventh active patterns ACT1 to ACT7 and the eighth active pattern ACT8 may be provided on the substrate SUB.

A gate insulating layer GI may be provided on the first to eighth active patterns ACT1 to ACT8.

The second scan lines S2i−1, S2i, and S2i+1, the emission control line E2i, the extension lines ELP1, ELP2, and ELP3, first to seventh gate electrodes GE1 to GE7, and a lower electrode LE of the storage capacitor Cst may be provided on the gate insulating layer GI.

A first insulating layer IL1 may be provided on the substrate SUB on which the second scan lines S2i−1, S2i, and S2i+1 and the like are provided.

An upper electrode UE of the storage capacitor Cst and the initialization power line IPL may be provided on the first insulating layer IL. The upper electrode UE may cover the lower electrode LE. The upper electrode UE along with the lower electrode LE may constitute the storage capacitor Cst with the first insulating layer IL1 interposed therebetween.

A second insulating layer IL2 may be provided on the substrate SUB on which the upper electrode UE and the like are provided.

The first to fourth data lines DL1, DL2, DL3, and DL4, the first metal layer MTL1, an auxiliary connection line AUX, first and second connection lines CNL1 and CNL2, the third metal layer MTL3, and the conductive pattern CPP may be provided on the second insulating layer IL2.

The third insulating layer IL3 may be provided on the substrate SUB on which the first to fourth data lines DL1, DL2, DL3, and DL4 and the like are provided.

The second metal layer MTL2, the fourth metal layer MTL4, and a bridge pattern BRP may be provided on the third insulating layer IL3.

The bridge pattern BRP may be connected to the second connection line CNL2 through a tenth contact hole CH10 passing through the third insulating layer IL3.

A protective layer PSV may be provided on the substrate SUB on which the second metal layer MTL2 and the like are provided.

A first electrode AD may be provided on the protective layer PSV.

The first electrode AD may be connected to the bridge pattern BRP through an eleventh contact hole CH11 passing through the protective layer PSV. The first electrode AD may be connected to each of a sixth drain electrode DE6 and a seventh source electrode SE7 of a corresponding second pixel PXL2_k, PXL2_k+1, PXL2_k+2, or PXL2_k+3 through the bridge pattern BRP and the second contact line CNL2.

A pixel defining layer PDL defining a light emitting region of each of the second pixels PXL2_k, PXL2_k+1, PXL2_k+2, and PXL2_k+3 may be provided on the substrate SUB on which the first electrode AD is provided.

An emitting layer EML may be provided in the light emitting region of each of the second pixels PXL2_k, PXL2_k+1, PXL2_k+2, and PXL2_k+3, surrounded by the pixel defining layer PDL, and a second electrode CD may be provided on the emitting layer EML.

An encapsulation layer SLM covering the second electrode CD may be provided on the second electrode CD.

Figure 20:
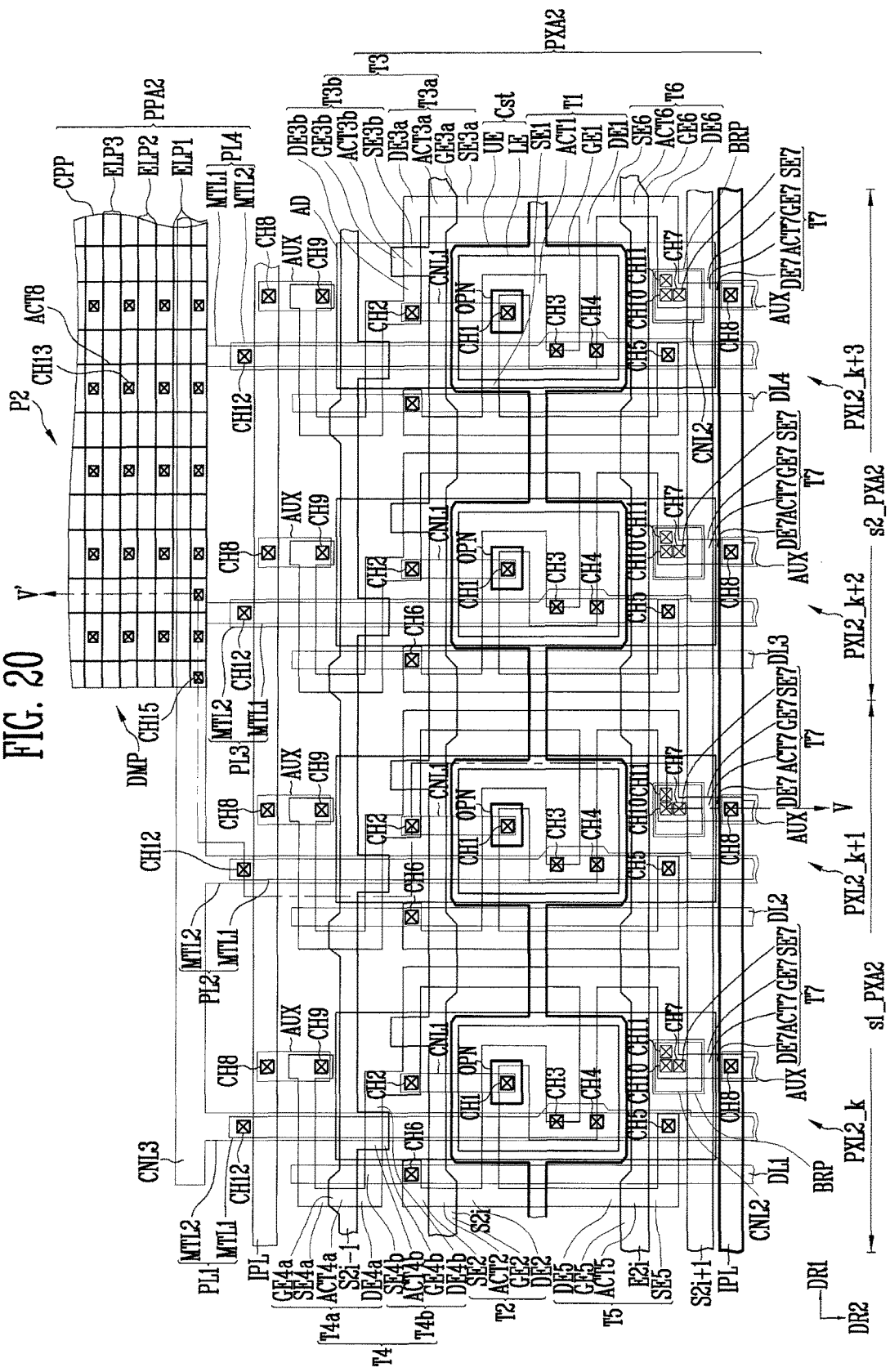
FIG. 20 illustrates a portion of a display device according to still another embodiment of the present disclosure, which is a plan view corresponding to the area P2 of FIG. 8A.
Figure 21:
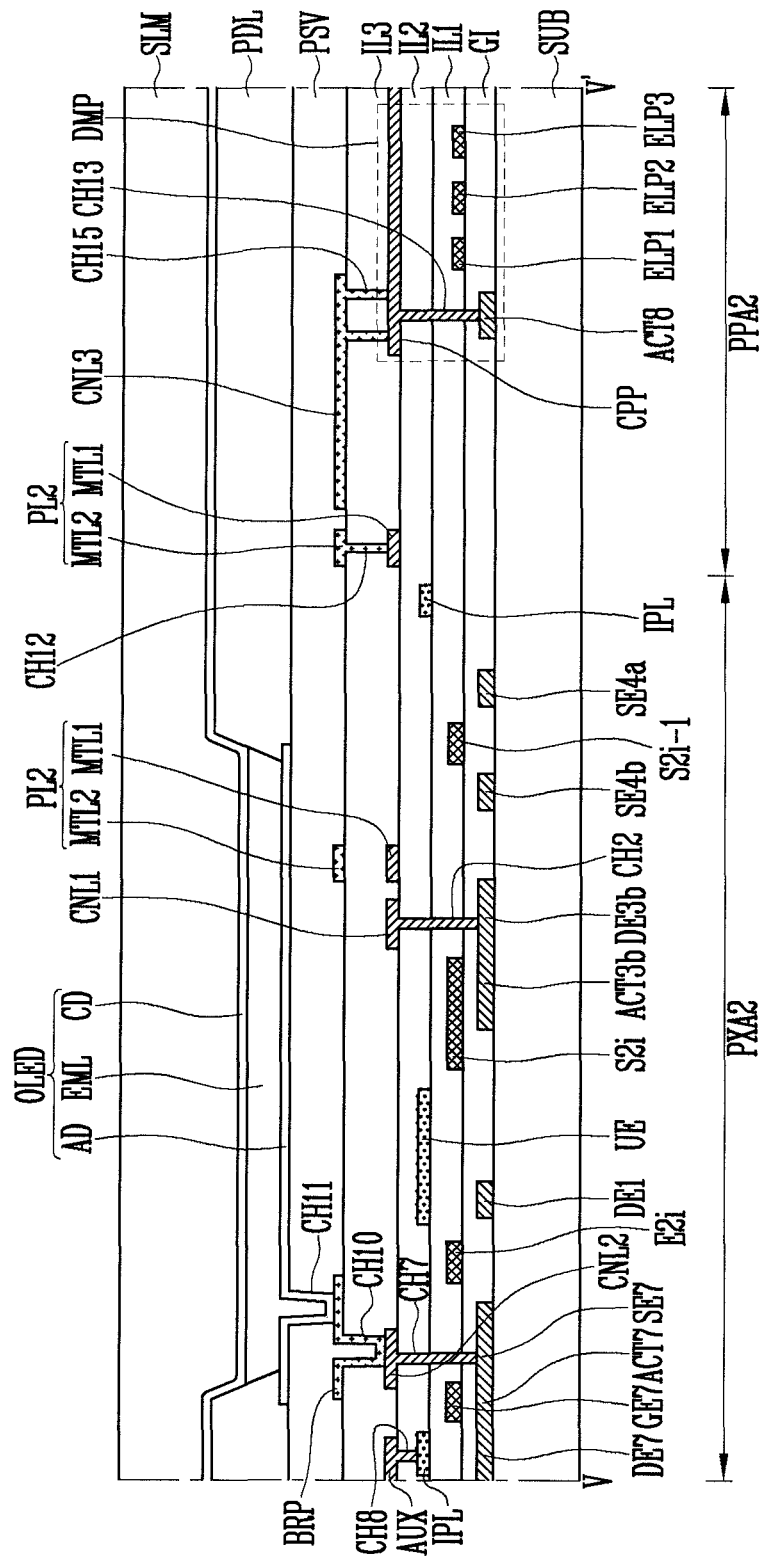
FIG. 21 is a sectional view taken along the line V-V' of FIG. 20.

FIG. 20 illustrates a portion of a display device according to still another embodiment of the present disclosure, which is a plan view corresponding to the area P2 of FIG. 8A. FIG. 21 is a sectional view taken along the line V-V' of FIG. 20. In FIGS. 20 and 21, differences from the above-described embodiment will be mainly described to avoid redundancy. Portions not particularly described in the still another embodiment of the present disclosure follow the above-described embodiment. In addition, identical reference numerals refer to identical components, and similar reference numerals refer to similar components.

Referring to FIGS. 1, 8A, 20, and 21, the display device according to the present embodiment may include a substrate SUB, a line unit, and second pixels PXL2_k, PXL2_k+1, PXL2_k+2, and PXL2_k+3.

The substrate SUB may include a second pixel region PXA2 in which the second pixels PXL2_k, PXL2_k+1, PXL2_k+2, and PXL2_k+3 are provided, and a second peripheral region PPA2 provided at the periphery of the second pixel region PXA2. A dummy part DMP may be located in the second peripheral region PPA2. Here, the second pixel region PXA2 may include a second sub-region s2_PXA2 corresponding to the dummy part DMP, and a first sub-region s1_PXA2 not corresponding to the dummy part DMP.

The line unit may include second scan lines S2$i$−1, S2$i$, and S2$i$+1, first to fourth data lines DL1, DL2, DL3, and DL4, an emission control line E2$i$, first to fourth power lines PL1, PL2, PL3, and PL4, and an initialization power line IPL, which provide signals to each of the second pixels PXL2_$k$, PXL2_$k$+1, PXL2_$k$+2, and PXL2_$k$+3.

Each of the first to fourth power lines PL1, PL2, PL3, and PL4 may be provided in a double layer including a first metal layer MTL1, and a second metal layer MTL2 located on the first metal layer MTL1. Here, the second metal layer MTL2 may be connected to the first metal layer MTL1 through a twelfth contact hole CH12 passing through a third insulating layer IL3.

The second pixels PXL2_$k$, PXL2_$k$+1, PXL2_$k$+2, and PXL2_$k$+3 may include a kth second pixel PXL2_$k$ connected to the second scan lines S2$i$−1, S2$i$, and S2$i$+1 and the first data line DL1, a (k+1)th second pixel PXL2_$k$+1 connected to the second scan lines S2$i$−1, S2$i$, and S2$i$+1 and the second data line DL2, a (k+2)th second pixel PXL2_$k$+2 connected to the second scan lines S2$i$−1, S2$i$, and S2$i$+1 and the third data line DL3, and a (k+3)th second pixel PXL2_$k$+3 connected to the second scan lines S2$i$−1, S2$i$, and S2$i$+1 and the fourth data line DL4.

Each of the kth second pixel PXL2_$k$, the (k+1)th second pixel PXL2_$k$+1, the (k+2)th second pixel PXL2_$k$+2, and the (k+3)th second pixel PXL2_$k$+3 may include an organic light emitting device OLED, first to seventh transistors T1 to T7, and a storage capacitor Cst.

The dummy part DMP and a third connection line CNL3 may be provided in the second peripheral region PPA2.

The dummy part DMP is used to compensate for a difference in load values between respective pixel regions PXA, and may include an eighth active pattern ACT8, extension lines ELP1, ELP2, and ELP3, and a conductive pattern CPP.

The conductive pattern CPP may overlap with the eighth active pattern ACT8 and the extension lines ELP1, ELP2, and ELP3 when viewed on a plane. The conductive pattern CPP may be connected to the eighth active pattern ACT8 through a thirteenth contact hole CH13.

The conductive pattern CCP may be integrally provided with the first metal layer MTL1 of each of the third and fourth power lines PL3 and PL4 connected to the second sub-region s2_PXA2. Therefore, the conductive pattern CPP may be connected to the third and fourth power lines PL3 and PL4. Accordingly, a first power source (see ELVDD of FIG. 3) applied to the third and fourth power lines PL3 and PL4 may be applied to the conductive pattern CCP. In this case, the conductive pattern CCP may be integrally provided with a first power supply line ELVDD to be electrically connected to the first power supply line ELVDD.

The third connection line CNL3 may be located in the second peripheral region PPA2, and may be located on the dummy part DMP when viewed on a plane. Specifically, the third connection line CNL3 does not overlap with the dummy part DMP in the first sub-region s1_PXA2, and may overlap with the dummy part DMP in the second sub-region s2_PXA2.

The third connection line CNL3 may be integrally provided with the second metal layer MTL2 of each of the first and second power lines PL1 and PL2 located in the first sub-region s1_PXA2. Therefore, the third connection line CNL3 may be electrically connected to the first and second power lines PL1 and PL2. Also, the third connection line CNL3 may be electrically connected to the conductive pattern CPP through a fifteenth contact hole CH15 passing through the third insulating layer IL3. Therefore, the first power source (see ELVDD of FIG. 3) applied to the conductive pattern CPP may also be applied to the third connection line CNL3.

The third connection line CNL3, the conductive pattern CPP, and the first to fourth power lines PL1, PL2, PL3, and PL4 may be electrically connected to one another to be arranged in a mesh form when viewed on a plane. Thus, if the first power source ELVDD is applied to the first to fourth power lines PL1, PL2, PL3, and PL4, the first power source ELVDD can be uniformly provided to the second pixel region PXA2. Accordingly, the second pixel region PXA2 can implement uniform luminance throughout the entire region.

In an embodiment of the present disclosure, a case where the fifteenth contact hole CH15 does not overlap with the thirteenth contact hole CH13 is illustrated for convenience of description, but the present disclosure is not limited thereto. For example, the fifteenth contact hole CH15 may be provided in the third insulating layer IL3 to overlap with the thirteenth contact hole CH13 when viewed on a plane.

Hereinafter, a structure of the display device according to the other embodiment of the present disclosure will be described along a stacking order with reference to FIGS. 20 and 21.

First, first to seventh active patterns ACT1 to ACT7 and the eighth active pattern ACT8 may be provided on the substrate SUB. The first to eighth active patterns ACT1 to ACT8 may be formed of a semiconductor material.

A gate insulating layer GI may be provided on the first to eighth active patterns ACT1 to ACT8.

The second scan lines S2$i$−1, S2$i$, and S2$i$+1, the emission control line E2$i$, the extension lines ELP1, ELP2, and ELP3, first to seventh gate electrodes GE1 to GE7, and a lower electrode LE of the storage capacitor Cst may be provided on the gate insulating layer GI.

A first insulating layer IL1 may be provided on the substrate SUB on which the second scan lines S2$i$−1, S2$i$, and S2$i$+1 and the like are provided.

An upper electrode UE of the storage capacitor Cst and the initialization power line IPL may be provided on the first insulating layer IL1. The upper electrode UE may cover the lower electrode LE. The upper electrode UE along with the lower electrode LE may constitute the storage capacitor Cst with the first insulating layer IL1 interposed therebetween.

A second insulating layer IL2 may be provided on the substrate SUB on which the upper electrode UE and the like are provided.

The first to fourth data lines DL1, DL2, DL3, and DL4, the first metal layer MTL1, an auxiliary connection line AUX, first and second connection lines CNL1 and CNL2, and the conductive pattern CPP may be provided on the second insulating layer IL2. Here, the conductive pattern CPP may be connected to the eighth active pattern ACT8 through the thirteenth contact hole CH13 sequentially passing through the gate insulating layer GI and the first and second insulating layers IL1 and IL2.

The third insulating layer IL3 may be provided on the substrate SUB on which the first to fourth data lines DL1, DL2, DL3, and DL4 and the like are provided.

A bridge pattern BRP, the second metal layer MTL2, and the third connection line CNL3 may be provided on the third insulating layer IL3.

The bridge pattern BRP may be connected to the second connection line CNL2 through a tenth contact hole CH10 passing through the third insulating layer 13. The second metal layer MTL2 may be connected to the first metal layer MTL1 through the twelfth contact hole CH12 passing through the third insulating layer 13. The third connection line CNL3 may be connected to the conductive pattern CPP through the fifteenth contact hole CH15 passing through the third insulating layer 13.

A protective layer PSV may be provided on the substrate SUB on which the second metal layer MTL2 and the like are provided.

A first electrode AD may be provided on the protective layer PSV.

The first electrode AD may be connected to the bridge pattern BRP through an eleventh contact hole CH11 passing through the protective layer PSV. The first electrode AD may be connected to each of a sixth drain electrode DE6 and a seventh source electrode SE7 of a finally corresponding second pixel PXL2_$k$, PXL2_$k$+1, PXL2_$k$+2, or PXL2_$k$+3 through the bridge pattern BRP and the second contact line CNL2.

A pixel defining layer PDL defining a light emitting region of each of the second pixels PXL2_$k$, PXL2_$k$+1, PXL2_$k$+2, and PXL2_$k$+3 may be provided on the substrate SUB on which the first electrode AD is provided.

An emitting layer EML may be provided in the light emitting region of each of the second pixels PXL2_$k$, PXL2_$k$+1, PXL2_$k$+2, and PXL2_$k$+3, surrounded by the pixel defining layer PDL, and a second electrode CD may be provided on the emitting layer EML.

An encapsulation layer SLM covering the second electrode CD may be provided on the second electrode CD.

The display device according to the embodiment of the present disclosure can be employed in various electronic devices. For example, the display device is applicable to televisions, notebook computers, cellular phones, smart phones, smart pads, PMPs, PDAs, navigations, various wearable devices such as smart watches, and the like.

As described above, according to the present disclosure, the display device has two or more regions having different areas, and luminances in the respective regions can be uniform.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
    a substrate including a first pixel region, a second pixel region having an area that is smaller than an area of the first pixel region and connected to the first pixel region, and a peripheral region at least partially surrounding the first pixel region and the second pixel region;
    a first pixel in the first pixel region;
    a second pixel in the second pixel region;
    a first line connected to the first pixel;
    a second line connected to the second pixel;
    an extension line connected to any one of the first line and the second line and extending to the peripheral region;
    a dummy part in the peripheral region, overlapping with the extension line, and for compensating for a difference between a load value of the first line and a load value of the second line;
    a power line connected to the first pixel region and the second pixel region; and
    a connection line in the peripheral region, connected to the dummy part, and electrically connected to a portion of the second pixel region,
    wherein the second pixel region includes a first sub-pixel region connected to the connection line, and a second sub-pixel region separate from the first sub-pixel region.

2. The display device of claim 1, wherein the dummy part comprises:
    a dummy active pattern on the substrate;
    a first insulating layer on the dummy active pattern, and defining a first contact hole exposing a portion of the dummy active pattern;
    the extension line on the first insulating layer; and
    a conductive pattern on the extension line with a second insulating layer therebetween, connected to the dummy active pattern through the first contact hole, and electrically connected to the connection line.

3. The display device of claim 2, wherein the conductive pattern and the connection line are in the same layer.

4. The display device of claim 2, wherein the dummy part does not correspond to the first sub-pixel region, and corresponds to the second sub-pixel region.

5. The display device of claim 4, wherein the first sub-pixel region and the second sub-pixel region have different shapes.

6. The display device of claim 2, wherein a fixed voltage is applied to the power line, and wherein a voltage having the same level as the fixed voltage is applied to the conductive pattern and the connection line.

7. The display device of claim 2, wherein the power line comprises:
    a first metal layer in the same layer as the conductive pattern and the connection line;
    a second metal layer on the first metal layer; and
    an interlayer insulating layer between the first and second metal layers, and defining a second contact hole through which a portion of the first metal layer is exposed,
    wherein the second metal layer is electrically connected to the first metal layer through the second contact hole.

8. The display device of claim 7, wherein the connection line comprises:
    a third metal layer integrally provided with the conductive pattern;
    a fourth metal layer on the third metal layer; and
    the interlayer insulating layer between the third and fourth metal layers, and defining a third contact hole through which a portion of the third metal layer is exposed,
    wherein the fourth metal layer is electrically connected to the third metal layer through the third contact hole.

9. The display device of claim 7, wherein the connection line is on the conductive pattern, and is electrically connected to the conductive pattern through a fourth contact hole through the interlayer insulating layer.

10. The display device of claim 2, wherein the peripheral region includes:
    a first peripheral region at the periphery of the first pixel region;

a second peripheral region at the periphery of the second pixel region; and
an additional peripheral region adjacent to the first pixel region and the second peripheral region.

11. The display device of claim 10, wherein the dummy part is in the second peripheral region.

12. The display device of claim 11, wherein the dummy part is electrically connected to the first sub-pixel region through the connection line.

13. The display device of claim 2, wherein the first line extends along a first direction on the substrate, and provides a scan signal to the first pixel, and
wherein the second line provides a scan signal to the second pixel along the first direction.

14. The display device of claim 13, wherein the second line extends to the peripheral region and is connected to the extension line.

15. The display device of claim 14, wherein the extension line is integrally provided with the second line.

16. The display device of claim 13, wherein a length of the first line is longer than a length of the second line.

17. The display device of claim 13, further comprising a first emission control line connected to the first pixel, and a second emission control line connected to the second pixel.

18. The display device of claim 17, wherein the second emission control line extends to the peripheral region and is connected to the extension line.

19. The display device of claim 13, further comprising a data line spaced apart from the power line and extending along a second direction that intersects the first direction.

20. The display device of claim 19, wherein the second pixel comprises a transistor connected to the second line, the data line, and the power line, the transistor comprising:
an active pattern on the substrate;
a gate electrode on the active pattern with a gate insulating layer interposed therebetween; and
source and drain electrodes each connected to the active pattern.

21. The display device of claim 20, further comprising a light emitting device connected to the transistor, and comprising:
a first electrode connected to the transistor;
an emitting layer on the first electrode; and
a second electrode on the emitting layer.

22. The display device of claim 2, further comprising a power supply line integrally formed with the conductive pattern, in the peripheral region, and at least partially surrounding an edge of the connection line.

23. The display device of claim 22, wherein the connection line has a shape corresponding to the power supply line.

24. The display device of claim 23, wherein the connection line has an inclined oblique shape in the peripheral region corresponding to a portion of the first sub-pixel region.

25. The display device of claim 23, wherein the connection line has a bent curved shape in the peripheral region corresponding to a portion of the first sub-pixel region.

26. The display device of claim 23, wherein the connection line has a step shape including a stepped part in the peripheral region corresponding to a portion of the first sub-pixel region.

27. The display device of claim 1, wherein the substrate further includes:
a third pixel region spaced apart from the second pixel region, and connected to the first pixel region; and
a third peripheral region at least partially surrounding the third pixel region.

28. The display device of claim 27, wherein the dummy part is in the third peripheral region.

29. The display device of claim 28, further comprising:
a third pixel provided in the third pixel region; and
a third line for providing a scan signal to the third pixel, and connected to the extension line.

\* \* \* \* \*